United States Patent
Oyama et al.

(10) Patent No.: US 12,253,413 B2
(45) Date of Patent: Mar. 18, 2025

(54) LIGHT DETECTION DEVICE

(71) Applicant: HAMAMATSU PHOTONICS K.K., Hamamatsu (JP)

(72) Inventors: Hiroki Oyama, Hamamatsu (JP); Katsumi Shibayama, Hamamatsu (JP); Takashi Kasahara, Hamamatsu (JP); Masaki Hirose, Hamamatsu (JP); Toshimitsu Kawai, Hamamatsu (JP); Yumi Kuramoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 253 days.

(21) Appl. No.: 17/288,593

(22) PCT Filed: Aug. 23, 2019

(86) PCT No.: PCT/JP2019/033079
§ 371 (c)(1),
(2) Date: Apr. 26, 2021

(87) PCT Pub. No.: WO2020/090200
PCT Pub. Date: May 7, 2020

(65) Prior Publication Data
US 2021/0396579 A1 Dec. 23, 2021

(30) Foreign Application Priority Data
Oct. 30, 2018 (JP) ................. 2018-204156

(51) Int. Cl.
*G01J 3/26* (2006.01)
*G01J 1/04* (2006.01)
(Continued)

(52) U.S. Cl.
CPC . *G01J 3/26* (2013.01); *G01J 1/04* (2013.01); *G01J 5/28* (2013.01); *G02B 5/28* (2013.01)

(58) Field of Classification Search
CPC ....... G01J 3/26; G01J 1/04; G01J 5/28; G02B 5/28
See application file for complete search history.

(56) References Cited

U.S. PATENT DOCUMENTS

| | | | |
|---|---|---|---|
| 9,419,159 B2* | 8/2016 | Sakamoto | ....... H01L 31/035281 |
| 2003/0072009 A1 | 4/2003 | Domash et al. | |
| 2009/0040616 A1* | 2/2009 | Lin | ........................... G01J 3/02 |
| | | | 359/579 |

FOREIGN PATENT DOCUMENTS

| | | |
|---|---|---|
| EP | 3064912 A1 | 9/2016 |
| JP | H05322653 A * | 12/1993 |

(Continued)

OTHER PUBLICATIONS

International Preliminary Report on Patentability mailed May 14, 2021 for PCT/JP2019/033079.

*Primary Examiner* — Uzma Alam
*Assistant Examiner* — Mohamed Doumbia
(74) *Attorney, Agent, or Firm* — Faegre Drinker Biddle & Reath LLP

(57) ABSTRACT

A spectroscopic sensor includes a wiring substrate having a main surface, a light detector disposed on the main surface of the wiring substrate, a Fabry-Perot interference filter, a spacer which is provided on the main surface of the wiring substrate and supports the Fabry-Perot interference filter so that the Fabry-Perot interference filter and the light detector are separated from each other, and a stem connected to a ground potential. A second current path which has a smaller electric resistance than that of an arbitrary first current path which extends from the Fabry-Perot interference filter to the light detector via the spacer and the wiring substrate is formed between the Fabry-Perot interference filter and the stem.

14 Claims, 23 Drawing Sheets

(51) Int. Cl.
*G01J 5/28* (2006.01)
*G02B 5/28* (2006.01)

(56) References Cited

FOREIGN PATENT DOCUMENTS

| | | | |
|---|---|---|---|
| JP | JP05322653 A * | 12/1993 | |
| JP | H8-128891 A | 5/1996 | |
| JP | 2013-026518 A | 2/2013 | |
| JP | 2013-072930 A | 4/2013 | |
| JP | 2014-071400 A | 4/2014 | |
| JP | 2015-087445 A | 5/2015 | |
| JP | 2018-189775 A | 11/2018 | |
| TW | 201725367 A | 7/2017 | |
| TW | 201837439 A | 10/2018 | |
| WO | WO-2016175089 A1 * | 11/2016 | ............ G01J 3/0286 |
| WO | WO-2018/030486 A1 | 2/2018 | |
| WO | WO-2018/159533 A1 | 9/2018 | |
| WO | WO-2018/203495 A1 | 11/2018 | |

* cited by examiner

LIGHT DETECTION DEVICE

TECHNICAL FIELD

The disclosure relates to a light detection device equipped with a Fabry-Perot interference filter.

BACKGROUND ART

Patent Document 1 discloses an optical element in which a Fabry-Perot interference filter and a light detector (a light receiving part) which receives light that has passed through the Fabry-Perot interference filter are integrally formed. A conductive fixed reflective film which faces a movable reflective film is provided in the optical element. Thus, generation of noise components (crosstalk noise) in a detection signal of the light detector when a driving voltage is applied to the Fabry-Perot interference filter is curbed.

CITATION LIST

Patent Document

[Patent Document 1] Japanese Unexamined Patent Publication No. 2015-87445

SUMMARY OF INVENTION

Technical Problem

However, in a structure in which the Fabry-Perot interference filter and the light detector are integrally formed as in the above-described optical element, since the Fabry-Perot interference filter and the light detector are in proximity to each other, it is difficult to sufficiently curb the crosstalk noise. On the other hand, it is conceivable to separate a mounting substrate on which the light detector is mounted from the Fabry-Perot interference filter using a support member such as a spacer. However, according to findings of the inventor, even when such a configuration is adopted, crosstalk noise may be mixed into the detection signal of the light detector due to a current component flowing from the Fabry-Perot interference filter to the light detector via the support member and the mounting substrate.

One aspect of the disclosure is to provide a light detection device capable of effectively curbing crosstalk noise in a detection signal of a light detector.

Solution to Problem

A light detection device according to one aspect of the disclosure includes a mounting substrate having a main surface, a light detector disposed on the main surface of the mounting substrate, a Fabry-Perot interference filter configured so that a distance between a pair of mirror parts changes due to an electrostatic force by forming a gap between the pair of mirror parts facing each other, a support member provided on the main surface of the mounting substrate and configured to support the Fabry-Perot interference filter so that the Fabry-Perot interference filter and the light detector are separated from each other, and a ground part connected to a ground potential, wherein a second current path having a smaller electrical resistance than that of an arbitrary first current path extending from the Fabry-Perot interference filter to the light detector via the support member and the mounting substrate is formed between the Fabry-Perot interference filter and the ground part.

In the light detection device, the Fabry-Perot interference filter and the light detector are separated by the support member. Thus, the distance between the Fabry-Perot interference filter and the light detector can be increased. As a result, crosstalk noise in a detection signal of the light detector due to a driving voltage applied to the Fabry-Perot interference filter is curbed. Further, in the light detection device, the second current path having a lower electrical resistance than that of an arbitrary first current path from the Fabry-Perot interference filter to the light detector via the support member and the mounting substrate is formed between the Fabry-Perot interference filter and the ground part (the ground potential). Therefore, the current component which flows from the Fabry-Perot interference filter to the support member is more likely to flow to the ground part than to the light detector. Thus, the crosstalk noise caused by the current component flowing from the Fabry-Perot interference filter to the light detector via the support member and the mounting substrate is curbed. As described above, according to the above-described light detector, the crosstalk noise in the detection signal of the light detector can be effectively curbed.

The light detection device may further include a conductive connecting member configured to electrically connect the support member or the mounting substrate to the ground part so that a current component flowing from the Fabry-Perot interference filter to the support member is released to the ground part. According to such a configuration, the current component which flows from the Fabry-Perot interference filter to the support member can be appropriately released to the ground part via the conductive connecting member.

The connecting member may electrically connect a region along the main surface of the mounting substrate to the ground part, and the second current path may be a path extending from the Fabry-Perot interference filter to the ground part via the support member, the region along the main surface, and the connecting member. According to such a configuration, the current component which will flow to the light detector via the mounting substrate can be appropriately released to the ground part via the connecting member.

The mounting substrate may include an insulating layer having a first surface as the main surface and a second surface on a side opposite to the first surface, and a metal layer provided on the second surface side of the insulating layer, and the region along the main surface may be the metal layer. According to such a configuration, while the insulation between the light detector and the metal layer is ensured by the insulating layer, the current component which will flow to the light detector can be appropriately released to the ground part via the metal layer.

An opening part which exposes a surface of the metal layer on an insulating layer side may be formed in the insulating layer, and the connecting member may be connected to the metal layer via the opening part and connected to the ground part. According to such a configuration, for example, the metal layer and the ground part can be appropriately and easily connected by wire bonding.

The metal layer may be provided at least at an edge portion of the mounting substrate when seen in a thickness direction of the mounting substrate, a portion of the metal layer provided at the edge portion of the mounting substrate may be exposed to the outside, and the connecting member may be a conductive resin material which is provided to cover the edge portion of the mounting substrate and connects the portion of the metal layer to the ground part.

According to such a configuration, the metal layer and the ground part can be appropriately and easily connected by providing the conductive resin material to cover the edge portion of the mounting substrate.

The metal layer may be provided to overlap a region on the mounting substrate in which the support member is provided when seen in the thickness direction of the mounting substrate. According to such a configuration, the current component which flows from the Fabry-Perot interference filter to the mounting substrate via the support member can be appropriately released to the ground part via the metal layer provided in a region directly below the support member.

The metal layer may be provided not to overlap the light detector when seen in the thickness direction of the mounting substrate.

According to such a configuration, the metal layer and the light detector do not have portions which face each other in the thickness direction of the mounting substrate. Thus, an influence of parasitic capacitance on the light detector can be curbed. As a result, it is possible to curb a decrease in a response speed of the detection signal of the light detector due to such parasitic capacitance.

The metal layer may be provided to overlap an arbitrary current path between the region on the mounting substrate in which the support member is provided and the light detector when seen in the thickness direction of the mounting substrate. According to such a configuration, the metal layer is formed to divide an arbitrary current path between the region on the mounting substrate in which the support member is provided and the light detector when seen in the thickness direction of the mounting substrate. Thus, the current component which will flow from the region in which the support member is provided to the light detector can be appropriately captured by the metal layer and can be released to the ground part.

The mounting substrate may have an insulating layer having a first surface as the main surface, and a metal layer provided between the first surface of the insulating layer and the support member, and the region along the main surface may be the metal layer. According to such a configuration, the current component which flows from the Fabry-Perot interference filter to the mounting substrate via the support member can be appropriately released to the ground part from the metal layer provided in the region directly below the support member.

The ground part may be a stem to which a surface of the mounting substrate on a side opposite to the main surface is fixed, the mounting substrate may include a first layer having a first surface as the main surface and a second surface on a side opposite to the first surface, and a second layer provided on the second surface side of the first layer, the connecting member may be disposed between a surface of the second layer on a side opposite to the first layer and the stem and electrically connect the surface of the second layer on the side opposite to the first layer to the stem, an electrical resistance of a current path extending from the support member to the stem via the first layer and the second layer may be smaller than that of a current path extending from the support member to the light detector via at least one of the first layer and the second layer, and the second current path may be a path extending from the Fabry-Perot interference filter to the stem via the support member, the first layer, the second layer, and the connecting member. According to such a configuration, the current component which flows from the Fabry-Perot interference filter to the mounting substrate via the support member can be appropriately released to the stem (the ground part) by passing through the inside of the mounting substrate (the first layer and the second layer).

The connecting member may electrically connect the support member to the ground part, and the second current path may be a path extending from the Fabry-Perot interference filter to the ground part via the support member and the connection member. According to such a configuration, before the current component which flows from the Fabry-Perot interference filter to the support member reaches the mounting substrate, the current component can be appropriately released from the support member to the ground part.

The light detection device may further include a metal film disposed between the support member and the Fabry-Perot interference filter, the connecting member may electrically connect the support member to the ground part via the metal film, and the second current path may be a path extending from the Fabry-Perot interference filter to the ground part via the metal film and the connecting member. According to such a configuration, before the current component which flows from the Fabry-Perot interference filter to the support member reaches the support member, the current component can be appropriately released from the metal film to the ground part.

Advantageous Effects of Invention

According to one aspect of the disclosure, it is possible to provide a light detection device capable of effectively curbing crosstalk noise in a detection signal of a light detector.

DESCRIPTION OF EMBODIMENTS

Figure 1:
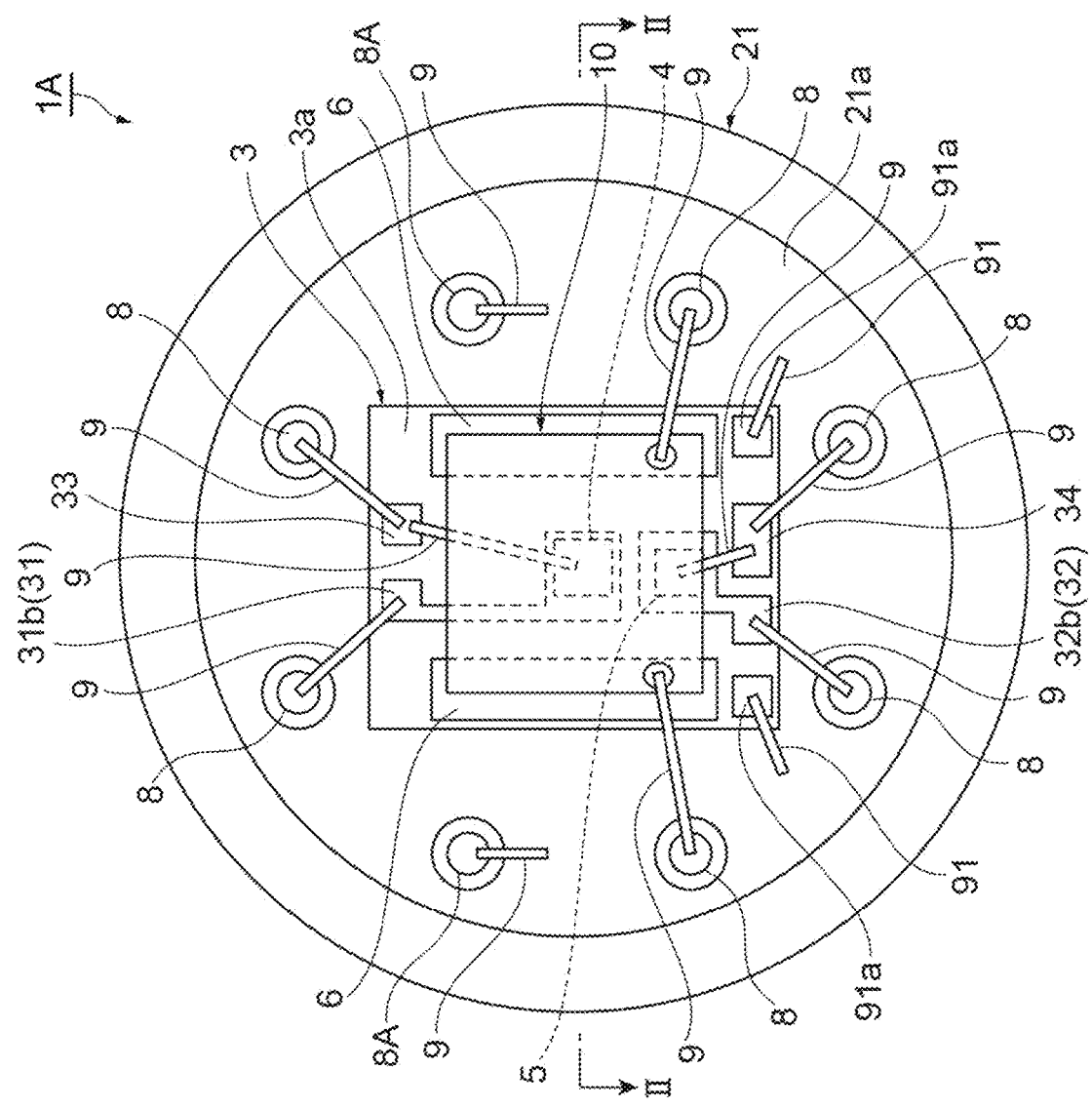
FIG. 1 is a plan view of a spectroscopic sensor according to a first embodiment.

Hereinafter, embodiments of the disclosure will be described in detail with reference to the accompanying drawings. In the description of the drawings, the same reference numerals are used for the same or equivalent elements, and duplicate description thereof will be omitted.

First Embodiment

[Configuration of Spectroscopic Sensor]

Figure 2:
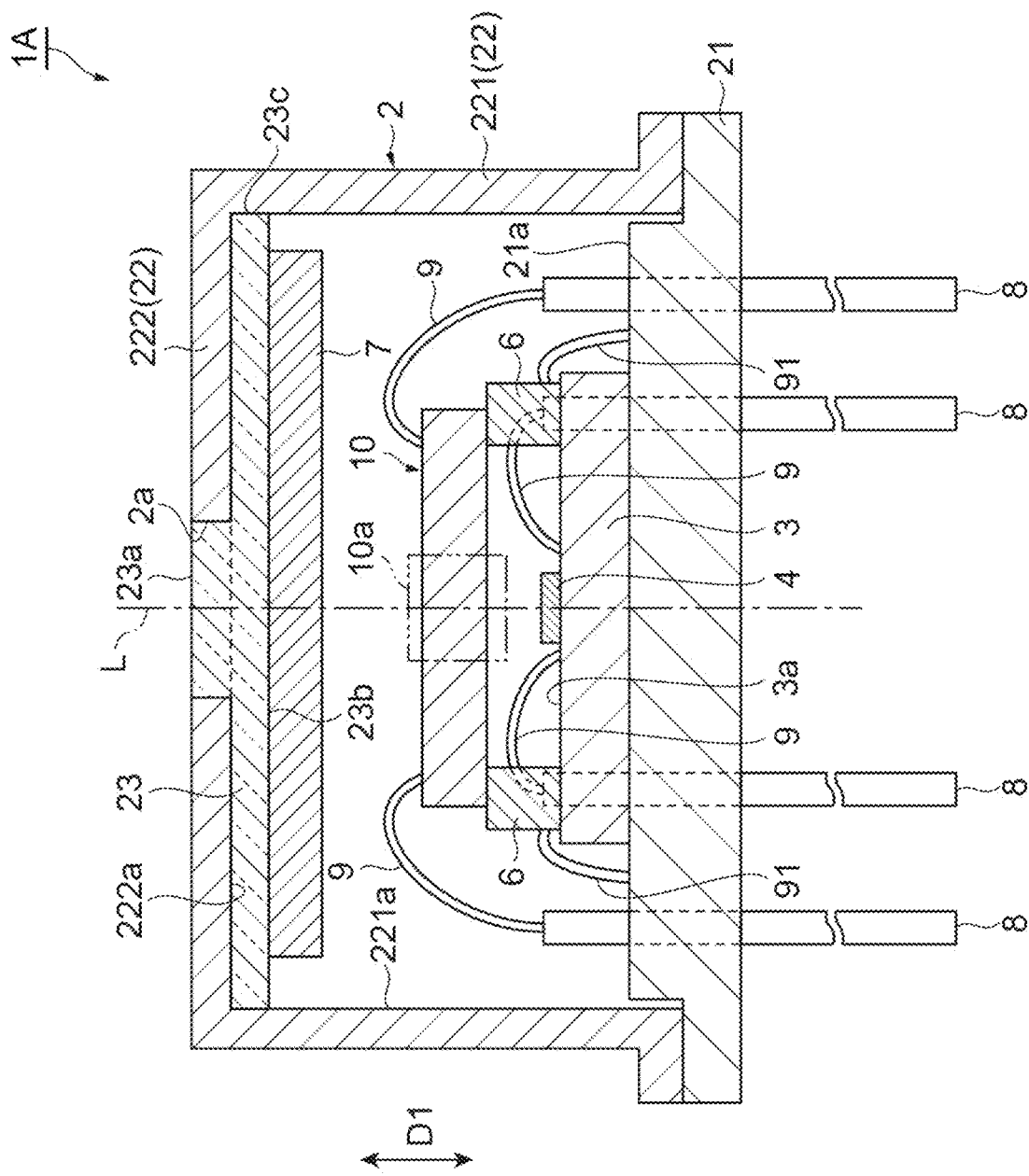
FIG. 2 is a cross-sectional view taken along line II-II of FIG. 1.
Figure 3:
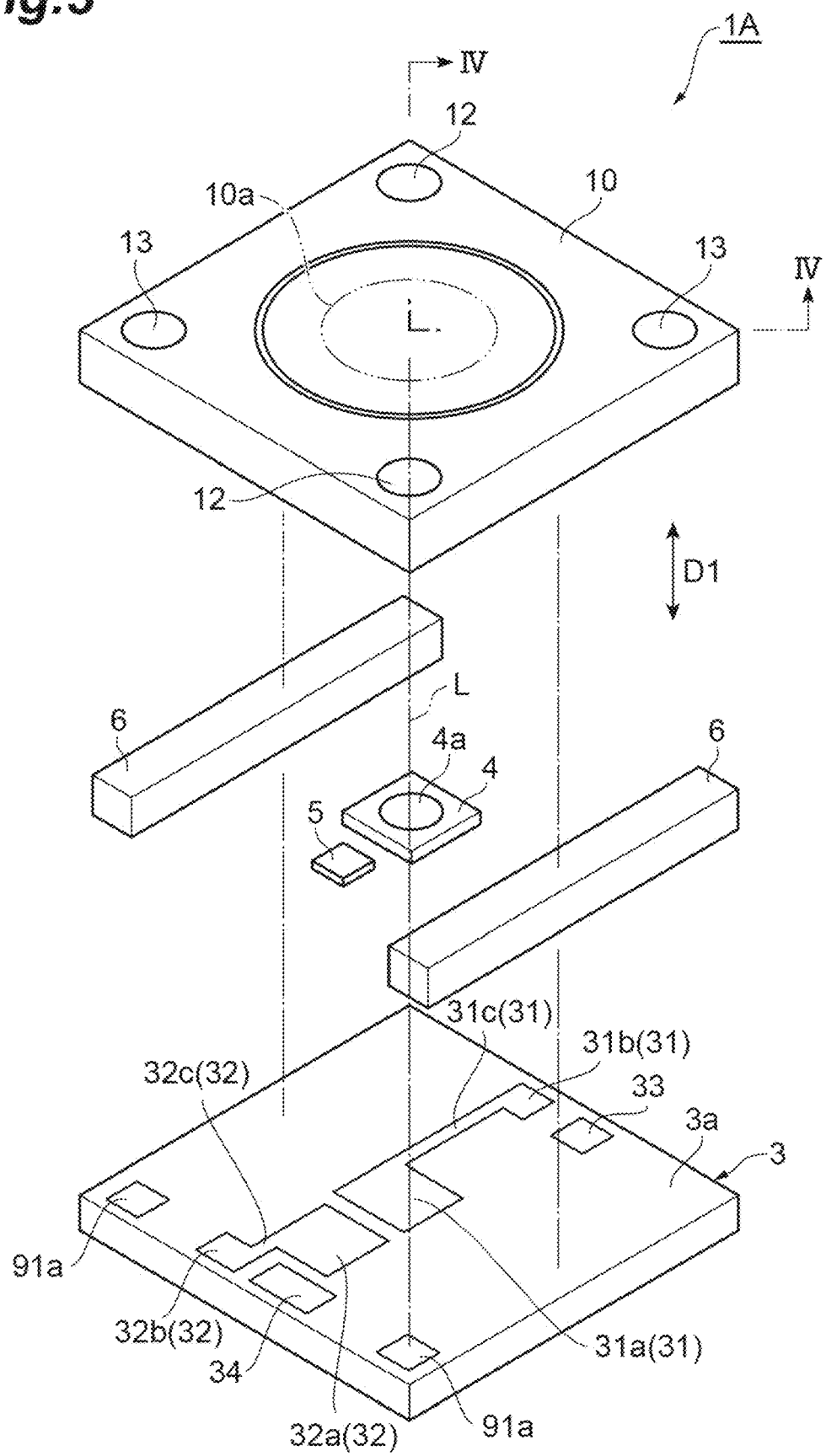
FIG. 3 is an exploded perspective view of a part of the spectroscopic sensor according to the first embodiment.

FIG. 1 is a plan view of a spectroscopic sensor (a light detection device) 1A. FIG. 2 is a cross-sectional view taken along line II-II of FIG. 1. FIG. 3 is an exploded perspective view of a part of the spectroscopic sensor 1A. In FIG. 1, illustration of a cap 22, a light transmitting member 23, and a band pass filter 7 which will be described later is omitted. As shown in FIGS. 1 and 2, the spectroscopic sensor 1A includes a package 2. The package 2 is a CAN package which accommodates a wiring substrate 3 (a mounting substrate), a light detector 4, a temperature compensation element 5 such as a thermistor, a plurality of (two in this case) spacers 6 (support members), a band pass filter 7, and a Fabry-Perot interference filter 10. The package 2 has a stem 21 (a ground part) and a cap 22. The cap 22 has a side wall 221 and a top wall 222 which are integrally formed. The stem 21 and the cap 22 are made of a metal material and are airtightly joined to each other. In the package 2, the side wall 221 is formed in a cylindrical shape with a predetermined line L as a center line. The top wall 222 is formed in a disk shape with the line L as a center line. The stem 21 and the top wall 222 face each other in a direction D1 parallel to the line L and respectively close both ends of the side wall 221. In the spectroscopic sensor 1A, the stem 21 is connected to a ground potential. The ground potential means an arbitrarily determined reference potential and is not limited to 0 V.

The wiring substrate 3 is fixed to an inner surface 21a of the stem 21. The light detector 4 and the temperature compensation element 5 are mounted (disposed) on a main surface 3a of the wiring substrate 3. The main surface 3a is a surface which faces the top wall 222 and the Fabry-Perot interference filter 10. As shown in FIG. 3, a wiring layer 31 on which the light detector 4 is mounted, a wiring layer 32 on which the temperature compensation element 5 is mounted, and electrode pads 33 and 34 for relay are provided on the main surface 3a of the wiring substrate 3. The wiring layer 31 has a mounting part 31a in which the light detector 4 is disposed, an electrode pad 31b, and a wiring part 31c which electrically connects the mounting part 31a to the electrode pad 31b. The wiring layer 32 has a mounting part 32a in which the temperature compensation element 5 is disposed, an electrode pad 32b, and a wiring part 32c which electrically connects the mounting part 32a to the electrode pad 32b. In the embodiment, as an example, the wiring layer 31, the wiring layer 32, the electrode pad 33, and the electrode pad 34 are formed of a laminated film made of Cr—Pt—Au. However, the wiring layer 31, the wiring layer 32, the electrode pad 33, and the electrode pad 34 may be formed of a material other than the above-described material and may be formed of, for example, a single-layer film such as Al or Au, or a laminated film such as Ti—Pt—Au, Ti—Ni—Au, and Cr—Au.

The light detector 4 is disposed on a line L. More specifically, the light detector 4 is disposed so that a center line of a light receiving part 4a coincides with the line L. The light detector 4 is, for example, an infrared detector which is a quantum sensor using InGaAs or the like, or a thermal sensor using a thermopile or a bolometer. When light in each of wavelength ranges of ultraviolet (UV), visible, and near infrared rays is detected, for example, a silicon photodiode or the like can be used as the light detector 4. The light detector 4 may have one light receiving part 4a, or may have a plurality of array-shaped light receiving parts 4a. Further, a plurality of light detectors 4 may be mounted on the wiring substrate 3.

A plurality of spacers 6 are fixed on the main surface 3a of the wiring substrate 3. The Fabry-Perot interference filter 10 is fixed on the plurality of spacers 6. That is, the plurality of spacers 6 support the Fabry-Perot interference filter 10 on the main surface 3a of the wiring substrate 3. A space is formed between the Fabry-Perot interference filter 10 and the main surface 3a of the wiring substrate 3 by such spacers 6, and the Fabry-Perot interference filter 10 and the light detector 4 are separated from each other. For example, silicon, ceramic, quartz, glass, plastic or the like can be used as a material of each of the spacers 6. The Fabry-Perot interference filter 10 is fixed on the plurality of spacers 6 by, for example, an adhesive. For example, a flexible resin material (for example, a resin material such as silicone-based, urethane-based, epoxy-based, acrylic-based, or hybrid materials) can be used as the adhesive for adhering the spacer 6 and the Fabry-Perot interference filter 10. The Fabry-Perot interference filter 10 is disposed on the line L. More specifically, the Fabry-Perot interference filter 10 is disposed so that a center line of a light transmission region 10a thereof coincides with the line L. The spacers 6 may be integrally formed with the wiring substrate 3. Further, the Fabry-Perot interference filter 10 may be supported by one spacer 6 instead of the plurality of spacers 6.

A plurality of lead pins 8 and 8A are fixed to the stem 21. More specifically, each of the lead pins 8 passes through the stem 21 in a state in which electrical insulation and airtightness with the stem 21 is maintained. The electrode pad 31b, the electrode pad 32b, the electrode pad 33, the electrode pad 34, and terminals (a first terminal 12, and a second terminal 13) of the Fabry-Perot interference filter 10 provided on the wiring substrate 3 are electrically connected to each of the lead pins 8 by a wire 9. The electrode pad 33 and the terminal of the light detector 4 are electrically connected by the wire 9. That is, the lead pin 8 and the light detector 4 are connected by two wires 9 via the electrode pad 33 for relay. In this case, even when a distance between the light detector 4 and the lead pin 8 is long, it is possible to prevent a short circuit at an unnecessary location and to improve a yield of the spectroscopic sensor 1A. However, the electrode pad 33 may be omitted, and the lead pin 8 and the light detector 4 may be connected by one wire 9 without interposing the electrode pad 33 therebetween. Similarly, the electrode pad 34 and the terminal of the temperature compensation element 5 are electrically connected by the wire 9. That is, the lead pin 8 and the temperature compensation element 5 are connected by two wires 9 via the electrode pad 34 for relay. In this case, even when a distance between the temperature compensation element 5 and the lead pin 8 is long, it is possible to prevent a short circuit at an unnecessary location and to improve the yield of the spectroscopic sensor 1A. However, the electrode pad 34 may be omitted, and the lead pin 8 and the temperature compensation element 5 may be connected by one wire 9 without interposing the electrode pad 34 therebetween. With the above connection configuration, input and output of an electrical signal to/from each of the light detector 4, the temperature compensation element 5, and the Fabry-Perot interference filter 10 is performed. Further, in the embodiment, as an example, two lead pins 8A connected to the ground potential are connected to the stem 21 by the wire 9. Thus, the stem 21 is connected to the ground potential.

An opening 2a is formed in the package 2. The opening 2a is formed in the top wall 222 of the cap 22 so that a center line of the opening 2a coincides with the line L. When seen in the direction D1, a shape of the opening 2a is circular. A light transmitting member 23 is disposed on an inner surface 222a of the top wall 222 to close the opening 2a. The light transmitting member 23 is airtightly joined to the inner surface 222a of the top wall 222. The light transmitting member 23 has a light incident surface 23a and a light emitting surface (an inner surface) 23b which face each other in the direction D1, and a side surface 23c. The light incident surface 23a of the light transmitting member 23 is substantially flush with an outer surface of the top wall 222 at the opening 2a. The side surface 23c of the light transmitting member 23 is in contact with an inner surface 221a of the side wall 221 of the package 2. That is, the light transmitting member 23 reaches the inside of the opening 2a and the inner surface 221a of the side wall 221. Such a light transmitting member 23 is formed, for example, by disposing glass pellets inside the cap 22 and melting the glass pellets in a state in which the opening 2a faces downward. That is, the light transmitting member 23 can be formed of fused glass.

The band pass filter 7 is fixed to the light emitting surface 23b of the light transmitting member 23 by an adhesive member or the like. The band pass filter 7 selectively transmits light in a measurement wavelength range of the spectroscopic sensor 1A (light in a predetermined wavelength range to be incident on the light transmission region 10a of the Fabry-Perot interference filter 10) among the light transmitted through the light transmitting member 23 (that is, only light in the predetermined wavelength range is transmitted). The band pass filter 7 has a quadrangular plate shape. The band pass filter 7 is, for example, a dielectric multilayer film (for example, a multilayer film configured of a combination of a high-refractive material such as $TiO_2$ and $Ta_2O_5$ and a low-refractive material such as $SiO_2$ and $MgF_2$) formed on a surface of the light transmitting member formed of a light transmitting material (for example, silicon, glass, or the like) in a quadrangular plate shape.

In the spectroscopic sensor 1A configured as described above, when light is incident on the band pass filter 7 from the outside through the light transmitting member 23, the light in a predetermined wavelength range is transmitted through the band pass filter 7. When the light transmitted through the band pass filter 7 is incident on the light transmission region 10a of the Fabry-Perot interference filter 10, light having a predetermined wavelength among the light in the predetermined wavelength range is selectively transmitted. The light transmitted through the light transmission region 10a of the Fabry-Perot interference filter 10 is incident on the light receiving part 4a of the light detector 4 and is detected by the light detector 4. That is, the light detector 4 converts the light transmitted through the Fabry-Perot interference filter 10 into an electrical signal and outputs it. For example, the light detector 4 outputs an electrical signal (a detection signal) having a size corresponding to an intensity of the light incident on the light receiving part 4a.

[Configuration of Fabry-Perot Interference Filter]

Figure 4:
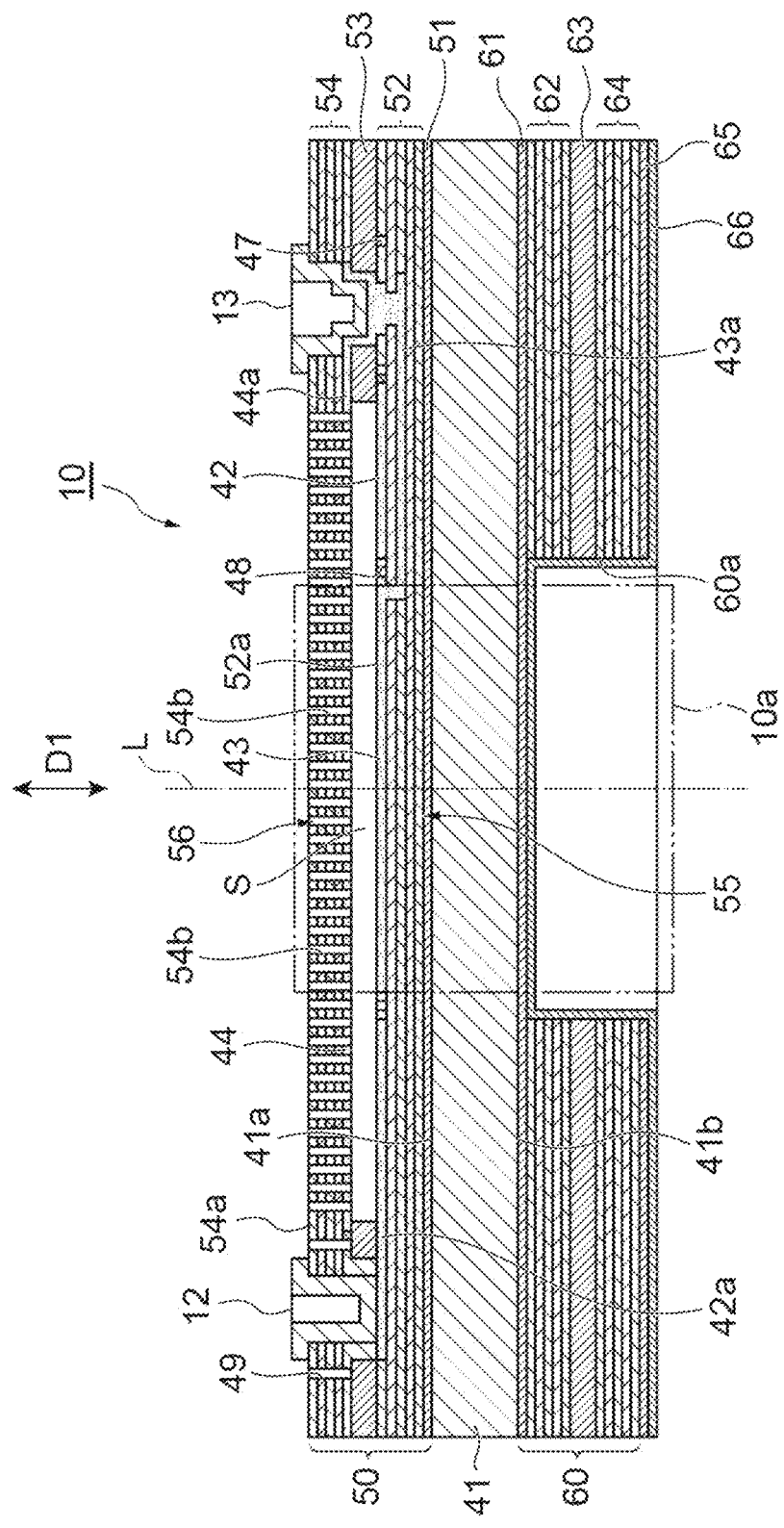
FIG. 4 is a cross-sectional view of a Fabry-Perot interference filter along IV-IV line of FIG. 3.

As shown in FIGS. 3 and 4, in the Fabry-Perot interference filter 10, the light transmission region 10a which transmits light according to a distance between a first mirror part 55 and a second mirror part 56 (between a pair of mirror parts) is provided on the line L. The light transmission region 10a is, for example, a cylindrical region. In the light transmission region 10a, the distance between the first mirror part 55 and the second mirror part 56 is controlled with extremely high accuracy. That is, the light transmission region 10a is a region in the Fabry-Perot interference filter 10 which can control the distance between the first mirror part 55 and the second mirror part 56 to a predetermined distance in order to selectively transmit light having a predetermined wavelength, and is a region through which light having a predetermined wavelength corresponding to the distance between the first mirror part 55 and the second mirror part 56 can be transmitted.

The Fabry-Perot interference filter 10 includes a rectangular plate-shaped substrate 41. The substrate 41 has a first surface 41a and a second surface 41b which face each other in the direction D1 parallel to the line L. The first surface 41a is a surface on the light incident side. The second surface 41b is a surface on the light detector 4 side (that is, the light emitting side). A first layer structure 50 is disposed on the first surface 41a. A second layer structure 60 is disposed on the second surface 41b.

The first layer structure 50 is configured by laminating a first antireflection layer 51, a first laminated body 52, a first intermediate layer 53, and a second laminated body 54 in this order on the first surface 41a. A void (an air gap) S is formed between the first laminated body 52 and the second laminated body 54 by the frame-shaped first intermediate layer 53. The substrate 41 is made of, for example, silicon, quartz, glass, or the like. When the substrate 41 is made of silicon, the first antireflection layer 51 and the first intermediate layer 53 are made of, for example, a silicon oxide. A thickness of the first intermediate layer 53 is, for example, several tens of nm to several tens of μm.

A portion of the first laminated body 52 corresponding to the light transmission region 10a serves as the first mirror part 55. The first laminated body 52 is formed by alternately laminating a plurality of polysilicon layers and a plurality of silicon nitride layers one by one. An optical thickness of each of the polysilicon layers and the silicon nitride layers constituting the first mirror part 55 is preferably an integral multiple of ¼ of a central transmission wavelength. The first mirror part 55 may be disposed directly on the first surface 41a without interposing the first antireflection layer 51 therebetween.

A portion of the second laminated body 54 corresponding to the light transmission region 10a serves as the second mirror part 56. The second mirror part 56 faces the first mirror part 55 via the void S in the direction D1. The second laminated body 54 is configured by alternately laminating a plurality of polysilicon layers and a plurality of silicon nitride layers one by one. An optical thickness of each of the polysilicon layers and the silicon nitride layers constituting the second mirror part 56 is preferably an integral multiple of ¼ of the central transmission wavelength.

In the first laminated body 52 and the second laminated body 54, a silicon oxide layer may be disposed instead of the silicon nitride layer. Further, in addition to the above-described materials, a titanium oxide, a tantalum oxide, a zirconium oxide, magnesium fluoride, an aluminum oxide, calcium fluoride, silicon, germanium, zinc sulfide and the like can be used as a material for each of the layers constituting the first laminated body 52 and the second laminated body 54.

A plurality of through holes 54b extending from a surface 54a of the second laminated body 54 on the side opposite to the first intermediate layer 53 to the void S are formed in a portion of the second laminated body 54 corresponding to the void S. The plurality of through holes 54b are formed to such an extent that they do not substantially affect a function of the second mirror part 56. The plurality of through holes 54b are used for removing a part of the first intermediate layer 53 by etching and forming the void S.

A first electrode 42 is formed in the first mirror part 55 to surround the light transmission region 10a. A second electrode 43 is formed in the first mirror part 55 to include the light transmission region 10a. That is, the first mirror part 55 includes the first electrode 42 and the second electrode 43. The first electrode 42 and the second electrode 43 are formed by doping the polysilicon layer closest to the void S in the first laminated body 52 with impurities and reducing resistance. A third electrode 44 is formed on the second mirror part 56. That is, the second mirror part 56 includes the third electrode 44. The third electrode 44 faces the first electrode 42 and the second electrode 43 via the void S in a direction parallel to the line L. The third electrode 44 is formed by doping the polysilicon layer closest to the void S in the second laminated body 54 with impurities and reducing resistance. A size of the second electrode 43 is preferably a size including the entire light transmission region 10a, but may be substantially the same as that of the light transmission region 10a.

A pair of first terminals 12 and a pair of second terminals 13 are formed on the first layer structure 50. The pair of first terminals 12 face each other with the light transmission region 10a interposed therebetween. Each of the first terminals 12 is disposed in a through hole which extends from the surface 54a of the second laminated body 54 to the first laminated body 52. Each of the first terminals 12 is electrically connected to the first electrode 42 via a wiring 42a. The pair of second terminals 13 face each other with the light transmission region 10a interposed therebetween in a direction perpendicular to the direction in which the pair of first terminals 12 face each other. Each of the second terminals 13 is disposed in a through hole which extends from the surface 54a of the second laminated body 54 to the inside of the first intermediate layer 53. Each of the second terminals 13 is electrically connected to the second electrode 43 via a wiring 43a, and is also electrically connected to the third electrode 44 via a wiring 44a.

Trenches 47 and 48 are provided in a surface 52a of the first laminated body 52 on the first intermediate layer 53 side. The trench 47 extends in an annular shape to surround a connection portion of the wiring 43a with the second terminal 13. The trench 47 electrically insulates the first electrode 42 from the wiring 43a. The trench 48 extends in an annular shape along an inner edge of the first electrode 42. The trench 48 electrically insulates the first electrode 42 from a region inside the first electrode 42 (that is, a region in which the second electrode 43 is present). A trench 49 is provided in the surface 54a of the second laminated body 54. The trench 49 extends in an annular shape to surround the first terminal 12. The trench 49 electrically insulates the first terminal 12 from the third electrode 44. A region inside each of the trenches 47, 48, and 49 may be an insulating material or a void.

The second layer structure 60 is configured by laminating a second antireflection layer 61, a third laminated body 62, a second intermediate layer 63, and the fourth laminated body 64 in this order on the second surface 41b. The second antireflection layer 61, the third laminated body 62, the second intermediate layer 63, and the fourth laminated body 64 have the same configuration as the first antireflection layer 51, the first laminated body 52, the first intermediate layer 53, and the second laminated body 54, respectively. As described above, the second layer structure 60 has a laminated structure symmetrical with the first layer structure 50 with reference to the substrate 41. That is, the second layer structure 60 is configured to correspond to the first layer structure 50. The second layer structure 60 has a function of curbing warpage of the substrate 41 and the like.

An opening 60a is formed in the third laminated body 62, the second intermediate layer 63, and the fourth laminated body 64 to include the light transmission region 10a. A center line of the opening 60a coincides with the line L. The opening 60a is, for example, a cylindrical region and has a diameter substantially the same as that of the light transmission region 10a. The opening 60a is open to the light emitting side, and a bottom surface of the opening 60a reaches the second antireflection layer 61. The opening 60a allows light transmitted through the first mirror part 55 and the second mirror part 56 to pass through.

A light-shielding layer 65 is formed on a surface of the fourth laminated body 64 on the light emitting side. The light-shielding layer 65 is made of, for example, aluminum or the like. A protective layer 66 is formed on a surface of the light-shielding layer 65 and an inner surface of the opening 60a. The protective layer 66 is made of, for example, an aluminum oxide. An optical influence due to the protective layer 66 can be ignored by setting a thickness of the protective layer 66 to 1 to 100 nm (preferably about 30 nm).

The Fabry-Perot interference filter 10 configured as described above has the pair of first mirror part 55 and second mirror part 56 which face each other via the void S, and a distance between the pair of mirror parts changes according to a potential difference generated between the pair of mirror parts (the first mirror part 55 and the second mirror part 56). That is, in the Fabry-Perot interference filter 10, a voltage (a driving voltage) is applied to the first electrode 42 and the third electrode 44 via the first terminal 12 and the second terminal 13. The voltage causes the potential difference between the first electrode 42 and the third electrode 44, and an electrostatic force corresponding to the potential difference is generated between the first electrode 42 and the third electrode 44. The second mirror part 56 is attracted to the side of the first mirror part 55 fixed to the substrate 41 by the electrostatic force, and the distance between the first mirror part 55 and the second mirror part 56 is adjusted. As described above, in the Fabry-Perot interference filter 10, the distance between the first mirror part 55 and the second mirror part 56 is variable.

A wavelength of light transmitted through the Fabry-Perot interference filter 10 depends on the distance between the first mirror part 55 and the second mirror part 56 in the light transmission region 10a. Therefore, the wavelength of the transmitted light can be appropriately selected by adjusting the voltage applied to the first electrode 42 and the third electrode 44. As the potential difference between the first electrode 42 and the third electrode 44 becomes larger, the distance between the first mirror part 55 and the second mirror part 56 becomes smaller, and thus the wavelength of light transmitted through the Fabry-Perot interference filter 10 becomes shorter. The second electrode 43 has the same potential as the third electrode 44. Therefore, the second electrode 43 serves as a compensation electrode which keeps the first mirror part 55 and the second mirror part 56 flat in the light transmission region 10a.

In the spectroscopic sensor 1A, for example, a spectroscopic spectrum can be obtained by detecting the intensity of light transmitted through the light transmission region 10a of the Fabry-Perot interference filter 10 with the light detector 4, while the voltage applied to the Fabry-Perot interference filter 10 is changed (that is, the distance between the first mirror part 55 and the second mirror part 56 in the Fabry-Perot interference filter 10 is changed).

[Structure of Wiring Substrate and Electrical Connection Configuration Between Components]

The spectroscopic sensor 1A has a structure for curbing generation of crosstalk noise in the detection signal of the light detector 4 due to the driving voltage applied to the Fabry-Perot interference filter 10. Specifically, in the spectroscopic sensor 1A, a current path (a second current path) having a smaller electric resistance than that of an arbitrary current path (a first current path) from the Fabry-Perot interference filter 10 to the light detector 4 via the spacers 6 and the wiring substrate 3 is formed between the Fabry-Perot interference filter 10 and the stem 21 (the ground potential). Thus, when a driving voltage is applied to the Fabry-Perot interference filter 10, most of the current component which will flow from the Fabry-Perot interference filter 10 to the wiring substrate 3 via the spacers 6 flows into the second current path. As a result, an amount of current reaching the light detector 4 via the first current path can be reduced, and the crosstalk noise in the detection signal can be curbed.

Before a specific structure of the spectroscopic sensor 1A is explained, first, a structure of a spectroscopic sensor 100 according to a comparative example will be described, and a mechanism by which the above-described crosstalk noise is generated in the spectroscopic sensor 100 will be described.

Figure 5:
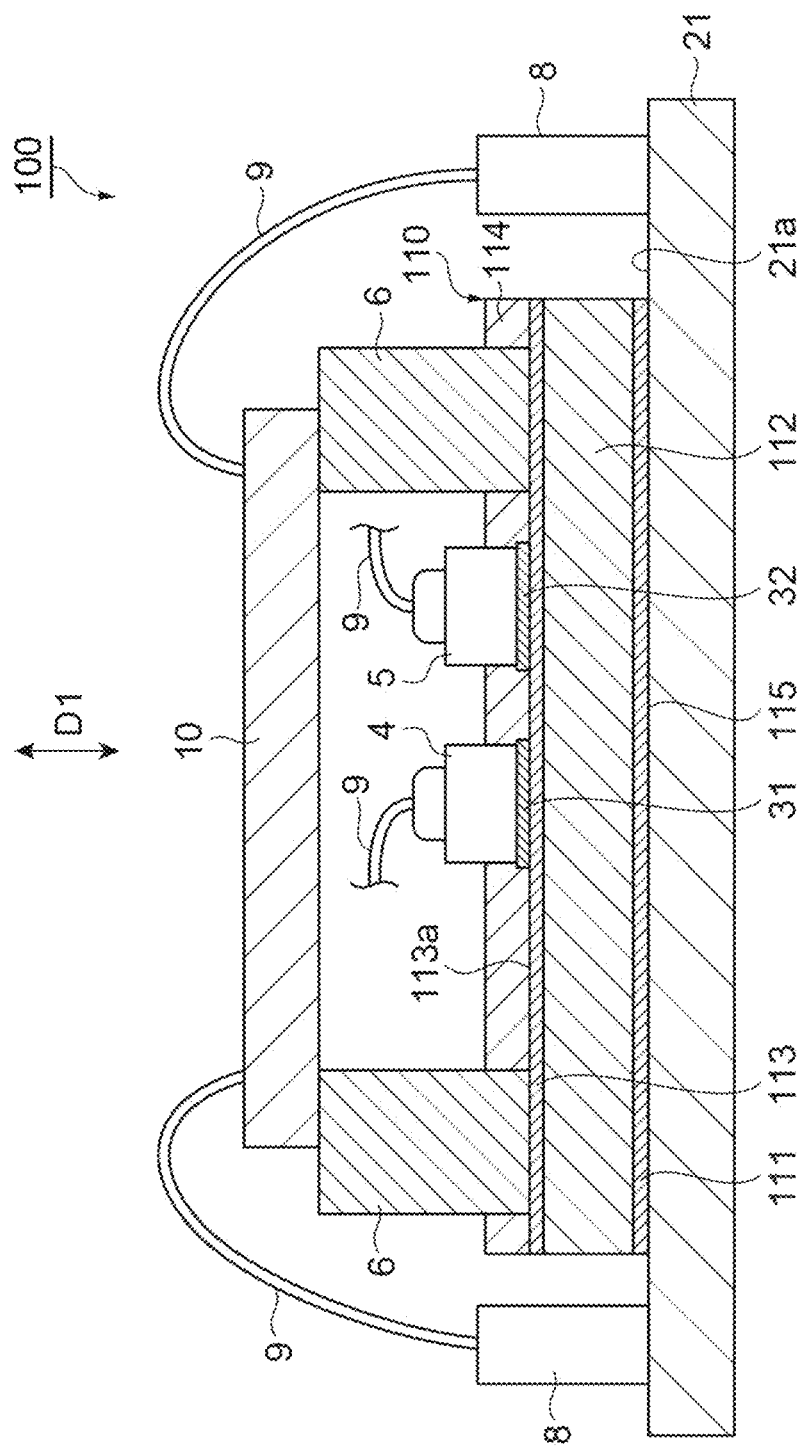
FIG. 5 is a schematic view showing a structure of a wiring substrate and an electrical connection configuration between components in a spectroscopic sensor according to a comparative example.

FIG. 5 is a schematic view showing a structure of a wiring substrate 110 and an electrical connection configuration between components in the spectroscopic sensor 100 according to the comparative example. The wiring substrate 110 has a structure in which a first insulating layer 111, a silicon layer 112, a second insulating layer 113, and a passivation film 114 are laminated in this order from the stem 21 side. Each of the first insulating layer 111 and the second insulating layer 113 is a silicon thermal oxide film formed by heating a surface of the silicon layer 112, and a thickness thereof is, for example, about 1 μm. The first insulating layer 111 is fixed to the inner surface 21a of the stem 21 via an adhesive layer 115 made of a non-conductive resin. The above-described wiring layers 31 and 32 are provided on a surface 113a of the second insulating layer 113 on the side opposite to the silicon layer 112. A thickness of each of the wiring layers 31 and 32 is, for example, about 0.5 μm. Further, the passivation film 114 is formed on the surface 113a of the second insulating layer 113 to cover the surface 113a, a side surface of the light detector 4, and a side surface of the temperature compensation element 5. A thickness of the passivation film 114 is, for example, about 10 μm.

Figure 6:
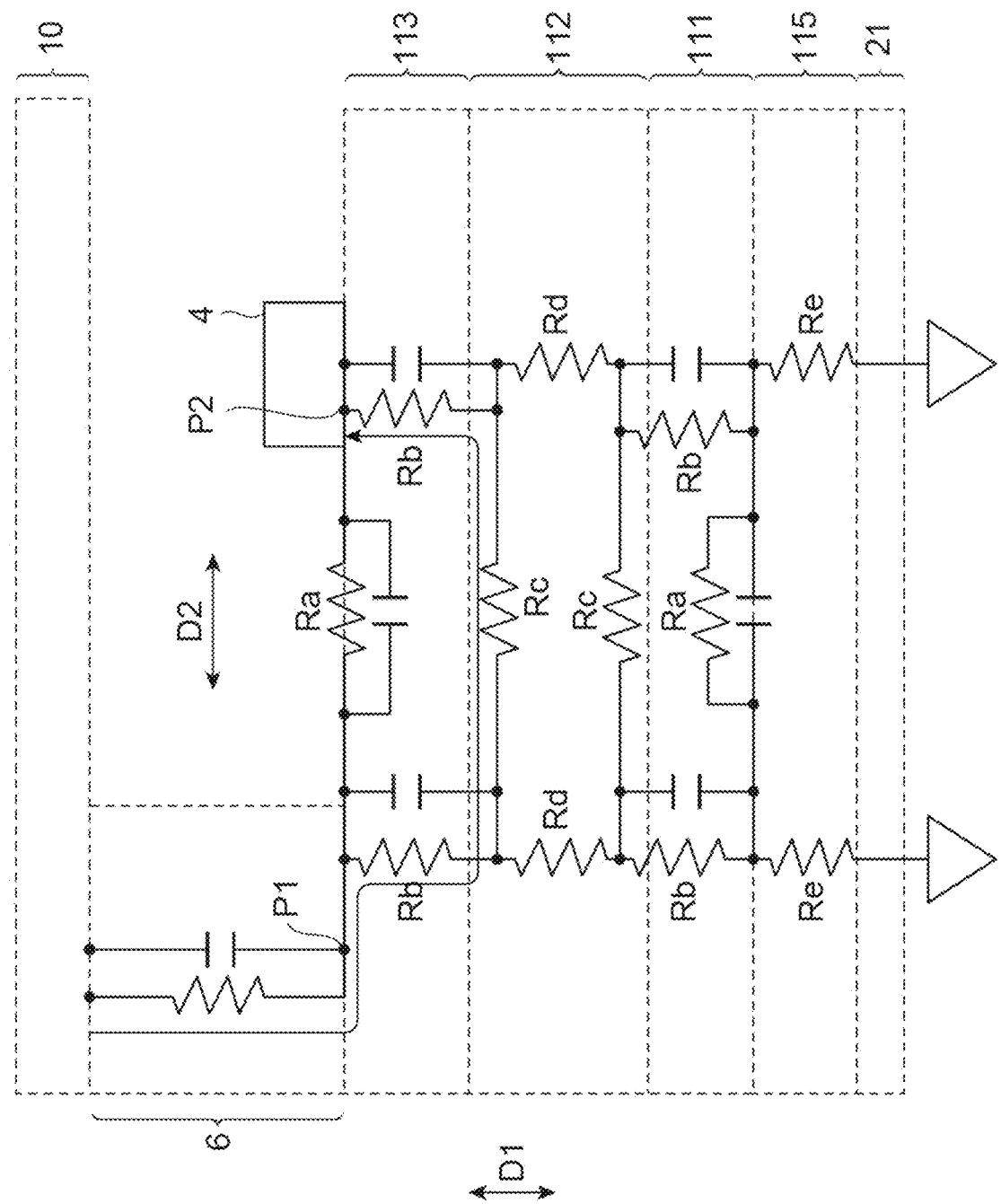
FIG. 6 is a view showing an equivalent circuit of the spectroscopic sensor according to the comparative example.

FIG. 6 is a view showing an equivalent circuit of the spectroscopic sensor 100. In FIG. 6, an electric resistance Ra is an electric resistance of a current path (a current path having a length from a portion P1 in which the wiring substrate 110 and the spacer 6 are in contact with each other to a portion P2 in which the wiring substrate 110 (the wiring layer 31) and the light detector 4 are in contact with each other) in the first insulating layer 111 or the second insulating layer 113 in a direction (a direction D2) orthogonal to a thickness direction (the direction D1) of the wiring substrate 110. An electric resistance Rb is an electric resistance of a current path which crosses the first insulating layer 111 or the second insulating layer 113 in the direction D1. An electric resistance Rc is an electric resistance of a current path (a current path having a length from the portion P1 to the portion P2) in the silicon layer 112 in the direction D2. An electrical resistance Rd is an electrical resistance of a current path which crosses the silicon layer 112 in the direction D1. An electrical resistance Re is an electrical resistance of a current path which crosses the adhesive layer 115 in the direction D1. Here, the electric resistance of each of the members (the first Insulating layer 111, the silicon layer 112, the second insulating layer 113, and the adhesive layer 115) is a value obtained by multiplying an electrical resistivity of the material of each of the members by "a length of each of the members÷a cross-sectional area of each of the members". Further, a thickness of each of the members (a length in the direction D1) is sufficiently smaller than the length from the portion P1 to the portion P2 in the direction D2. Further, a cross-sectional area of each of the members in the direction D1 is sufficiently smaller than a cross-sectional area of each of the members in the direction D2. Thus, "Ra>>Rb" and "Rc>>Rd" are established. Further, since the adhesive layer 115 is non-conductive, "Re>>Rc" is established. Further, since the resistivity of the silicon thermal oxide film (the first insulating layer 111, and the second insulating layer 113) is sufficiently larger than that of silicon (the silicon layer 112), "Rb>>Rc" is established. Here, "A>>B" means that A is sufficiently (very) larger than B.

Since the driving voltage applied to the Fabry-Perot interference filter 10 is a high voltage, when the above-described driving voltage is applied to the Fabry-Perot interference filter 10, a current component which flows from the Fabry-Perot interference filter 10 into the wiring substrate 110 via the spacer 6 is generated. Further, as described above, since a relationship of "Ra>>Rb>>Rc>>Rd" and "Re>>Rc" is established for the electric resistances Ra to Re, most of the current component will flow in a current path in a direction of an arrow shown in FIG. 6 (that is, a current path having the lowest electrical resistance). That is, most of the current component moves from the portion P1 in the second insulating layer 113 in the direction D1 to reach the silicon layer 112, subsequently moves in the silicon layer 112 in the direction D2, subsequently moves in the second insulating layer 113 in the direction D1, and flows to the light detector 4 (the wiring layer 31).

Figure 7:
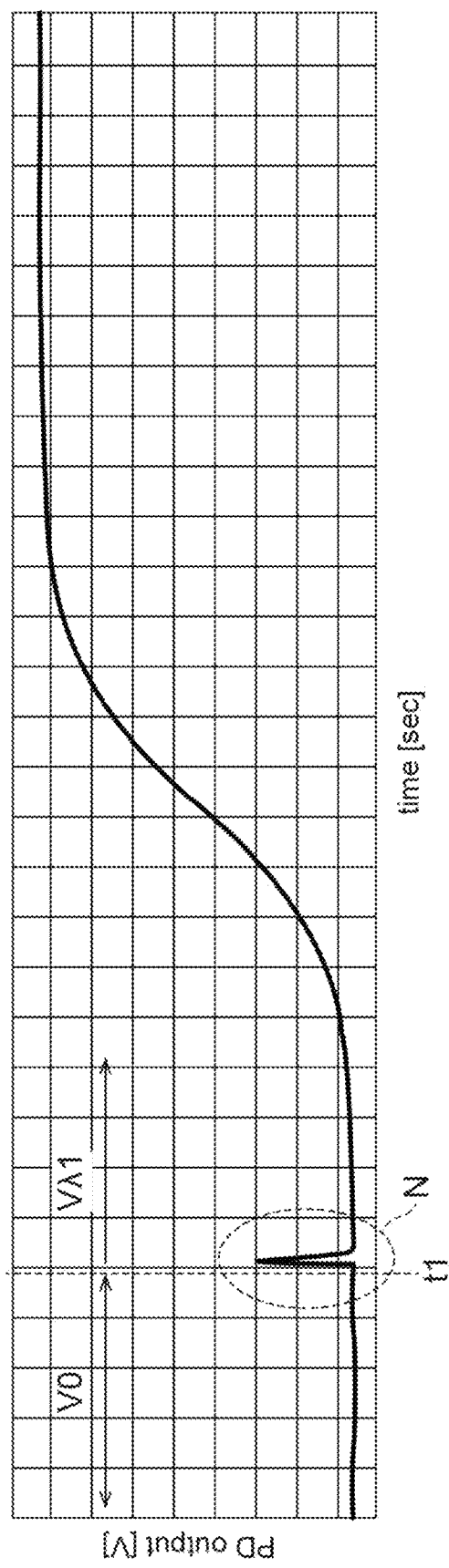
FIG. 7 is a view showing crosstalk noise in the spectroscopic sensor according to the comparative example.

FIG. 7 is a view showing the crosstalk noise observed by the spectroscopic sensor 100 according to the comparative example. The inventor has observed the crosstalk noise as follows. That is, in a state in which light having a predetermined wavelength λ1 is continuously incident on the light transmission region 10a of the Fabry-Perot interference filter 10, at a certain point in time t1, the driving voltage applied to the first electrode 42 and the third electrode 44 was changed from a voltage V0 (=0v) to a voltage Vλ1 in which light having a wavelength λ1 can be transmitted. As a result, it was confirmed that pulse-shaped crosstalk noise N was generated immediately after the driving voltage was changed from the voltage V0 to the voltage Vλ1. Although such crosstalk noise N is instantaneous, it may cause a problem according to a method of use (a measurement method) of the spectroscopic sensor 100.

Figure 8:
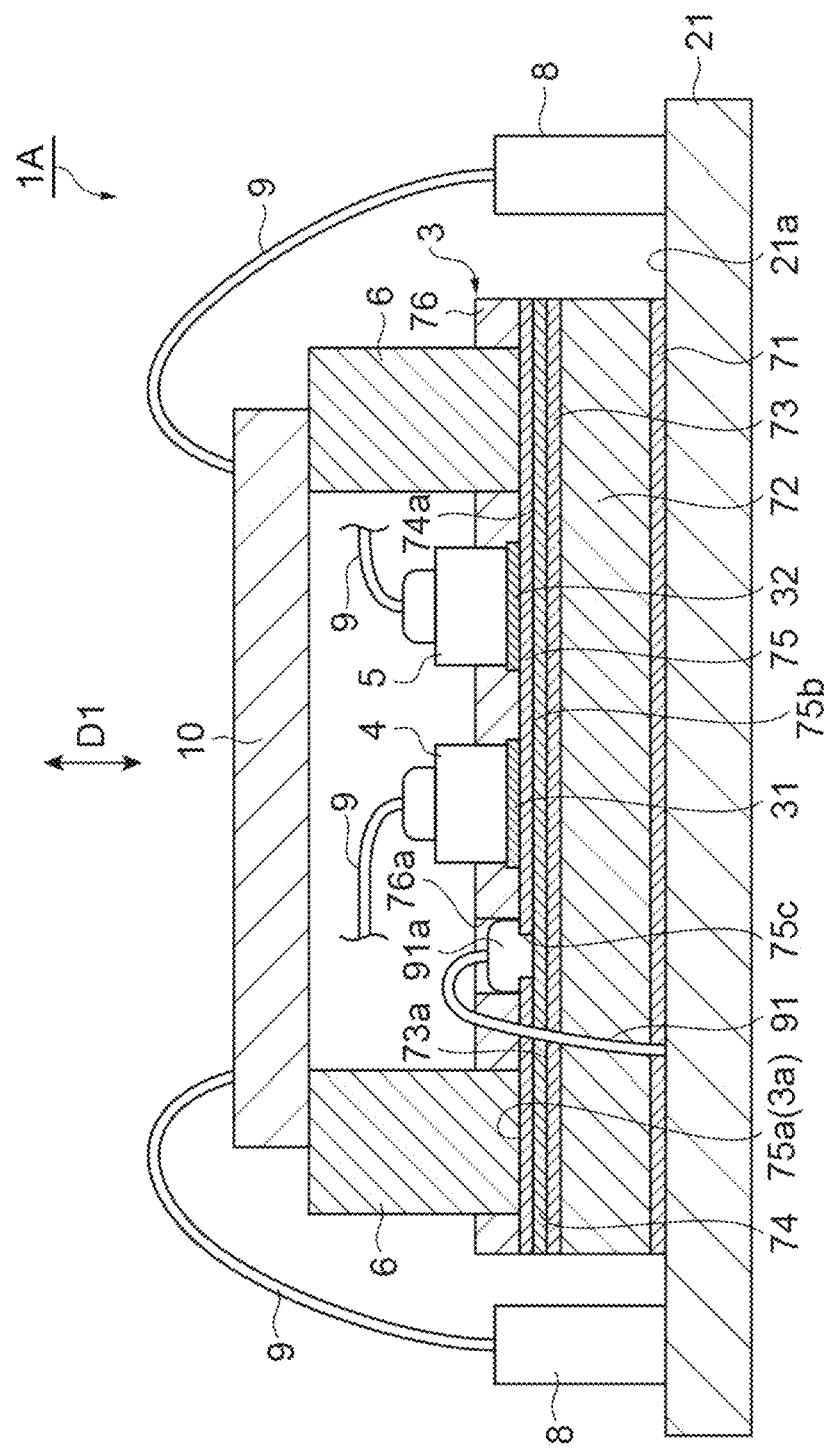
FIG. 8 is a schematic view showing a structure of a wiring substrate and an electrical connection configuration between components in the spectroscopic sensor according to the first embodiment.

Next, with reference to FIG. 8, the structure of the wiring substrate 3 and the electrical connection configuration between components in the spectroscopic sensor 1A will be described. The wiring substrate 3 has a structure in which a first insulating layer 71, a silicon layer 72, a second insulating layer 73, a metal layer 74, a third insulating layer 75 (an insulating layer), and a passivation film 76 are laminated in this order from the stem 21 side. The first insulating layer 71, the silicon layer 72, and the second insulating layer 73 are the same as the first insulating layer 111, the silicon layer 112, and the second insulating layer 113 in the spectroscopic sensor 100. Therefore, the wiring substrate 3 is mainly different from the wiring substrate 110 in the spectroscopic sensor 100 in that the metal layer 74 and the third insulating layer 75 are provided between the second insulating layer 73 and the wiring layers 31 and 32.

Each of the first insulating layer 71 and the second insulating layer 73 is a silicon thermal oxide film formed by heating a surface of the silicon layer 72, and a thickness thereof is, for example, about 1 μm. The first insulating layer 71 is fixed to the inner surface 21a of the stem 21 via an adhesive layer made of a non-conductive resin (an adhesive layer similar to the adhesive layer 115). The metal layer 74 is provided on a surface 73a of the second insulating layer 73 on the side opposite to the silicon layer 72. In the embodiment, as an example, the metal layer 74 is provided on the entire surface 73a of the second insulating layer 73. Further, the metal layer 74 is formed of a monolayer film made of Al. However, the metal layer 74 may be formed of a material other than the above-described material, and may be formed of, for example, a single layer film of a metal material (for example, Au or the like) other than Al or a laminated film of Ti—Pt—Au, Ti—Ni—Au, Cr—Au or the like. A thickness of the metal layer 74 is, for example, about 1 μm.

The third insulating layer 75 has a first surface 75a which is a main surface 3a of the wiring substrate 3, and a second surface 75b on the side opposite to the first surface 75a. The third insulating layer 75 is formed of, for example, a material such as TEOS, SiN, $SiO_2$, BPSG, an SOG film (glass), polyimide, or an insulating resin. A thickness of the third insulating layer 75 is, for example, about 1 μm. The wiring layers 31 and 32 and the electrode pads 33 and 34 described above are provided on the first surface 75a side of the third insulating layer 75. On the other hand, the metal layer 74 is provided on the second surface 75b side of the third insulating layer 75. That is, the wiring layers 31 and 32, the electrode pads 33 and 34, and the metal layer 74 are insulated by the third insulating layer 75. Thus, the light detector 4 and the metal layer 74 are insulated from each other. The passivation film 76 is formed on the first surface 75a of the third insulating layer 75 to cover the first surface 75a, the side surface of the light detector 4, and the side surface of the temperature compensation element 5. A thickness of the passivation film 76 is, for example, about 10 μm.

An opening part 75c which exposes a surface 74a of the metal layer 74 on the third insulating layer 75 side is formed in the third insulating layer 75. An opening part 76a which communicates with the opening part 75c is also in the passivation film 76. Thus, a part of the surface 74a of the metal layer 74 is exposed to the outside in at least a part of a region on the wiring substrate 3. Further, as shown in FIGS. 1, 2 and 8, a part of the surface 74a of the metal layer 74 and the inner surface 21a of the stem 21 are electrically connected by a wire 91 (a connecting member). In the embodiment, a bonding pad 91a (a connecting member) electrically connected to a part of the surface 74a of the metal layer 74 is provided inside the opening part 75c and the opening part 76a. Additionally, one end of the wire 91 is connected to the bonding pad 91a. On the other hand, the other end of the wire 91 is connected to the inner surface 21a of the stem 21. In the embodiment, as an example, the metal layer 74 and the stem 21 are electrically connected to each other via the wire 91 and the bonding pad 91a at two locations on the wiring substrate 3. Specifically, when seen in the direction D1, the opening part 75c, the opening part 76a, and the bonding pad 91a are provided at each of positions (two corners of the rectangular wiring substrate 3) adjacent to each of the plurality of spacers 6. Then, each of the bonding pads 91a is electrically connected to the inner surface 21a of the stem 21 adjacent to each of the bonding pads 91a via a wire 91. Thus, the current component which flows from the Fabry-Perot interference filter 10 to the wiring substrate 3 via each of the spacers 6 can be appropriately released to the stem 21. The metal layer 74 and the stem 21 may be connected to each other by the wire 91 and the bonding pad 91a at one location or three or more locations.

[Effects]

In the above-described spectroscopic sensor 1A, the Fabry-Perot interference filter 10 and the light detector 4 are separated by the spacers 6. Thus, a distance between the Fabry-Perot interference filter 10 and the light detector 4 can be increased. As a result, crosstalk noise in the detection signal of the light detector 4 due to the driving voltage applied to the Fabry-Perot interference filter 10 is curbed. Further, in the spectroscopic sensor 1A, a current path (the second current path) having a smaller electric resistance than that of an arbitrary current path from the Fabry-Perot interference filter 10 to the light detector 4 via the spacers 6 and the wiring substrate 3 is formed between the Fabry-Perot interference filter 10 and the stem 21 (the ground potential). In the embodiment, a current path from the Fabry-Perot interference filter 10 to the stem 21 via the spacers 6, the third insulating layer 75, the metal layer 74, the bonding pad 91a, and the wire 91 corresponds to the second current path. Therefore, the current component which flows from the Fabry-Perot interference filter 10 to the spacers 6 is more likely to flow to the stem 21 than to the light detector 4. Thus, the crosstalk noise caused by the current component flowing from the Fabry-Perot interference filter 10 to the light detector 4 via the spacers 6 and the wiring substrate 3 is curbed. Accordingly, according to the spectroscopic sensor 1A, the crosstalk noise in the detection signal of the light detector 4 can be effectively curbed.

Further, the spectroscopic sensor 1A includes a conductive connecting member (in the embodiment, the wire 91 and the bonding pad 91a) which electrically connects the wiring substrate 3 to the stem 21 so that the current component flowing from the Fabry-Perot interference filter 10 to the spacer 6 is released to the stem 21. According to the configuration, the current component flowing from the Fabry-Perot interference filter 10 to the spacer 6 can be appropriately released to the stem 21 via the conductive connecting member. More specifically, the connecting member (the wire 91 and the bonding pad 91a) electrically connects a region (the metal layer 74 in the embodiment) along the main surface 3a of the wiring substrate 3 to the stem 21. Additionally, the second current path is a path which extends from the Fabry-Perot interference filter 10 to the stem 21 via the spacer 6, the region (the metal layer 74) along the main surface 3a, and the connecting member (the wire 91 and the bonding pad 91a). According to the configuration, the current component which will flow to the light detector 4 via the wiring substrate 3 can be appropriately released to the stem 21 via the connecting member (the wire 91 and the bonding pad 91a).

Further, the wiring substrate 3 includes the third insulating layer 75 having the first surface 75a as the main surface 3a and the second surface 75b on the side opposite to the first surface 75a, the wiring layer 31 provided on the first surface 75a side of the third insulating layer 75 and on which the light detector 4 is mounted, and the metal layer 74 provided on the second surface 75b side of the third insulating layer 75. According to the configuration, while the insulation between the light detector 4 and the metal layer 74 is ensured by the third insulating layer 75, the current component which will flow to the light detector 4 can be appropriately released to the stem 21 via the metal layer 74.

Further, the opening part 75c which exposes the surface 74a of the metal layer 74 is formed in the third insulating layer 75. The connecting member (the wire 91 and the bonding pad 91a) is connected to the metal layer 74 via the opening part 75c and connected to the stem 21. According to the configuration, the metal layer 74 and the stem 21 can be appropriately and easily connected by the wire bonding. A length of the wire 91 which connects the bonding pad 91a to the stem 21 can be shortened, and interference between the wire 91 and the other wires 9 can be easily avoided by providing the opening part 75c (that is, the bonding pad 91a) as close as possible to an outer edge portion of the wiring substrate 3 (an edge portion of the wiring substrate 3 when seen in the direction D1) as in the embodiment.

Modified Example

Figure 9:
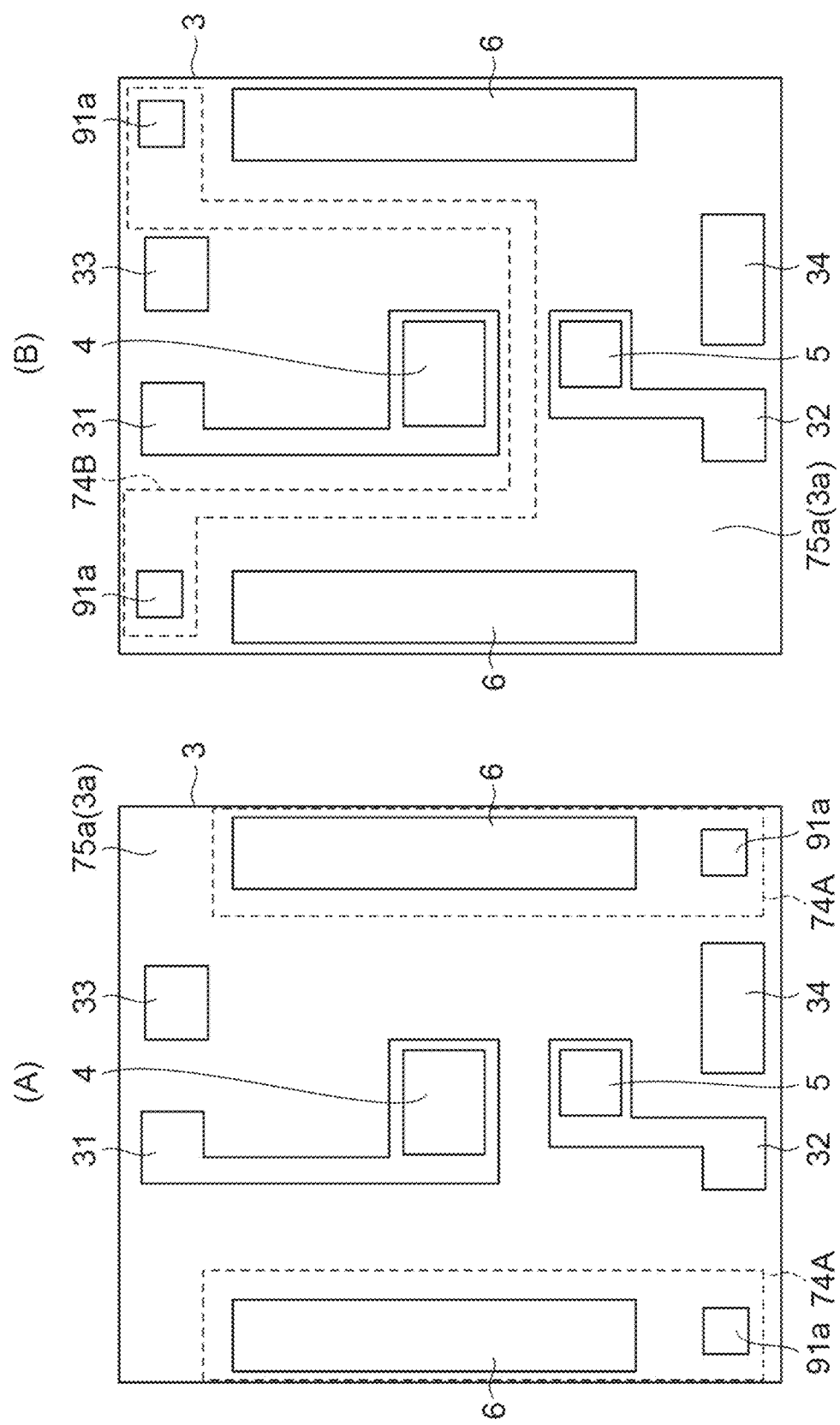
FIG. 9 is a view showing a modified example of a metal layer.
Figure 10:
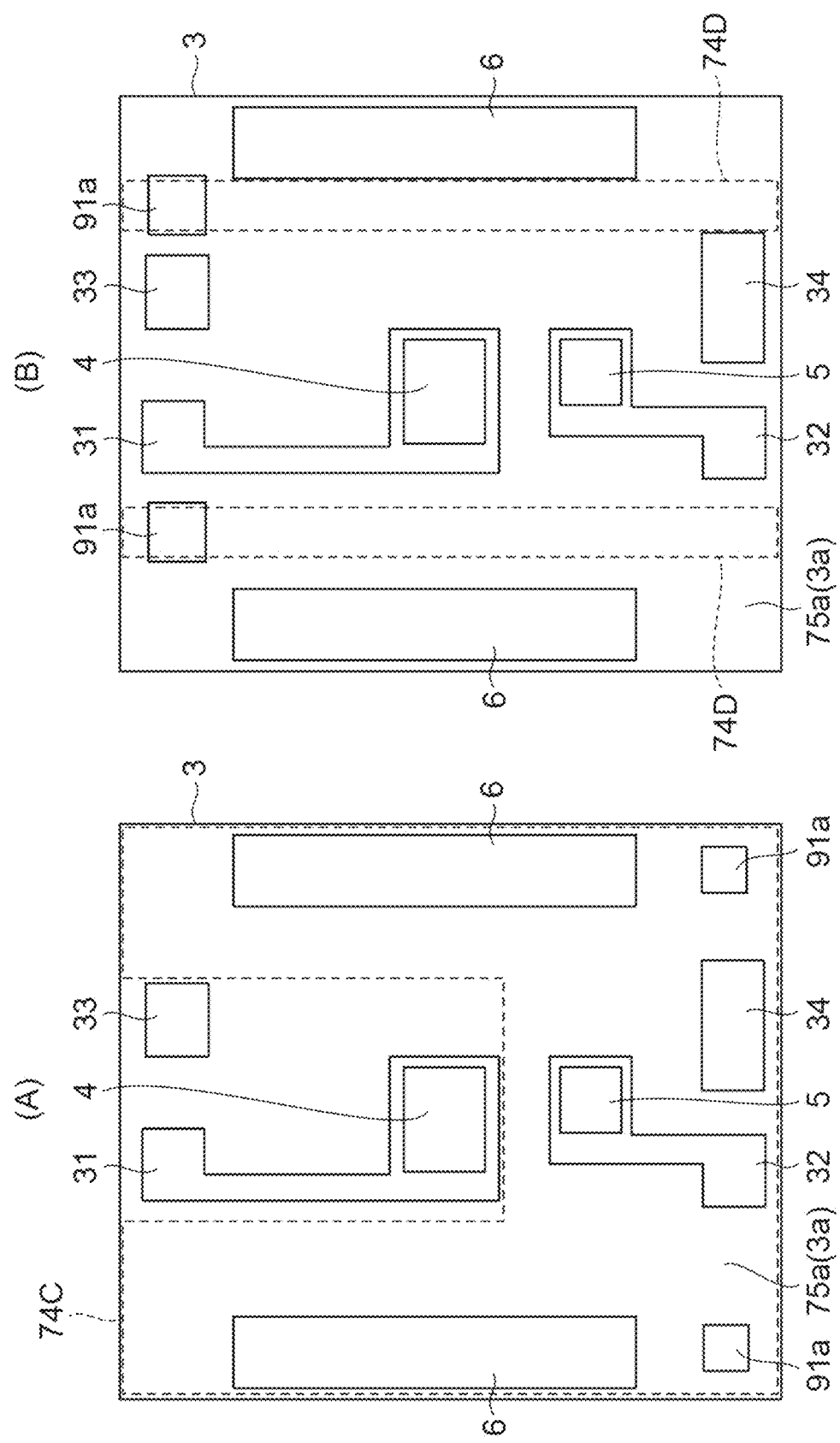
FIG. 10 is a view showing a modified example of the metal layer.

In the first embodiment, the metal layer 74 is provided on the entire surface 73a of the second insulating layer 73, but a metal layer provided only on a part of the surface 73a of the second insulating layer 73 may be adopted. For example, as shown in FIGS. 9 and 10, metal layers 74A to 74D may be provided instead of the metal layer 74. In this case, the third insulating layer 75 is directly provided on the second insulating layer 73 in the portion in which the metal layers 74A to 74D are not provided.

The two metal layers 74A shown in (A) of FIG. 9 is provided to overlap the region on the wiring substrate 3 in which the spacer 6 is provided (in other words, the region in which the spacers 6 and the wiring substrate 3 are in contact with each other via an adhesive resin or the like) when seen in the direction D1. As an example, the metal layer 74A is provided for each of the spacers 6. Specifically, each of the metal layers 74A is provided in a rectangular region including the region in which the spacer 6 is provided when seen in the direction D1. The above-described opening part 75c and opening part 76a (refer to FIG. 8), and the bonding pad 91a connected to the metal layer 74A are provided in a portion of each of the metal layers 74A which does not overlap the spacers 6. According to the configuration, the current component which flows from the Fabry-Perot interference filter 10 to the wiring substrate 3 via the spacer 6 can be appropriately released to the stem 21 via the metal layer 74A provided in a region directly below the spacers 6. More specifically, the current component which flows from a bottom surface of the spacer 6 to the wiring substrate 3 can be reliably captured by the metal layer 74A provided in the region directly below the spacers 6. As a result, the current component can be appropriately induced to the stem 21.

The metal layer 74B shown in (B) of FIG. 9 is provided to overlap an arbitrary current path between the region in which the spacer 6 is provided and the light detector 4 when seen in the direction D1 (in this embodiment, an arbitrary current path between the region in which the spacer 6 is provided and the wiring layer 31). That is, the metal layer 74B is formed to have a portion which divides the arbitrary current path between the region in which the spacer 6 is provided and the light detector 4 when seen in the direction D1. As an example, the metal layer 74B is formed to cover a region including the wiring layer 31 with respect to each of spacers 6 when seen in the direction D1. Thus, the current component which will flow from the region in which the spacer 6 is provided to the light detector 4 can be appropriately captured by the metal layer 74B and released to the stem 21. Here, as an example, the bonding pad 91a connected to the metal layer 74B via the above-described opening part 75c and opening part 76a (refer to FIG. 8) is provided at two locations corresponding to both ends of the metal layer 74B.

The metal layer 74C shown in (A) of FIG. 10 is provided in a region other than the rectangular region including the wiring layer 31 (here, the region including the wiring layer 31 and the electrode pad 33). Further, the above-described opening part 75c and opening part 76a (refer to FIG. 8), and the bonding pad 91a connected to the metal layer 74C are provided in a region in which the metal layer 74C and the spacer 6 do not overlap (here, two places as an example). Like the metal layer 74A, the metal layer 74C has a portion which overlaps the region in which the spacer 6 is provided in the wiring substrate 3 when seen in the direction D1. Further, like the metal layer 74B, the metal layer 74C has a portion which divides the arbitrary current path extending from the region in which the spacer 6 is provided to the light detector 4 when seen in the direction D1. Therefore, according to the metal layer 74C, the above-described effects of both the metal layer 74A and the metal layer 74B are exhibited.

The two metal layers 74D shown in (B) of FIG. 10 are provided in an extending direction of each of the spacers 6 (a direction orthogonal to a direction in which the spacers 6 face each other) to divide the arbitrary current path between the region in which each of the spacers 6 is provided and the light detector 4 when seen in the direction D1. The above-described opening part 75c and opening part 76a (refer to FIG. 8) and the bonding pad 91a connected to the metal layer 74D are provided at an end portion of each of the metal layers 74D. The same effect as that of the above-described metal layer 74B can be obtained by such two metal layers 74D.

The above-described effects exhibited by the metal layers 74A to 74D are similarly exhibited by the metal layer 74 provided on the entire surface 73a of the second insulating layer 73. On the other hand, the metal layers 74A to 74D are provided not to overlap the light detector 4 when seen in the direction D1. More specifically, the metal layers 74A to 74D are provided not to overlap the wiring layer 31 electrically connected to the light detector 4 when seen in the direction D1. In this configuration, the wiring layer 31 and the metal layers 74A to 74D do not have portions which face each other in the direction D1. That is, the metal layers 74A to 74D are formed so that the wiring layer 31 and the metal layers 74A to 74D do not come close to each other with the third insulating layer 75 interposed therebetween. Thus, a parasitic capacitance generated in the wiring layer 31 can be appropriately curbed, and an influence of the parasitic capacitance on the light detector 4 can be curbed. As a result, it is possible to curb a decrease in a response speed of the detection signal of the light detector 4 due to the parasitic capacitance.

The metal layer 74B shown in (B) of FIG. 9 and the metal layer 74D shown in (B) of FIG. 10 do not overlap the spacer 6 when seen in the direction D1. Thus, there is a possibility that some of the current component flowing from the bottom surface of the spacer 6 to the wiring substrate 3 moves in the second insulating layer 73 and the third insulating layer 75 and flows into the silicon layer 72 in the region directly below the spacer 6. Therefore, in order to enhance the effect of reducing the crosstalk noise, parts of the metal layers 74B and 74D may be brought into contact with the silicon layer 72 by providing an opening in a part of the second insulating layer 73 located between the metal layers 74B and 74D and the silicon layer 72. Thus, even when some of the current component flows into the silicon layer 72 as described above, some of the current component can be appropriately released from a contact portion between the silicon layer 72 and the metal layers 74B and 74D to the metal layers 74B and 74C. As a result, the current component which flows from the Fabry-Perot interference filter 10 to the light detector 4 can be appropriately curbed, and the crosstalk noise in the detection signal of the light detector 4 can be curbed more effectively.

Second Embodiment

Figure 11:
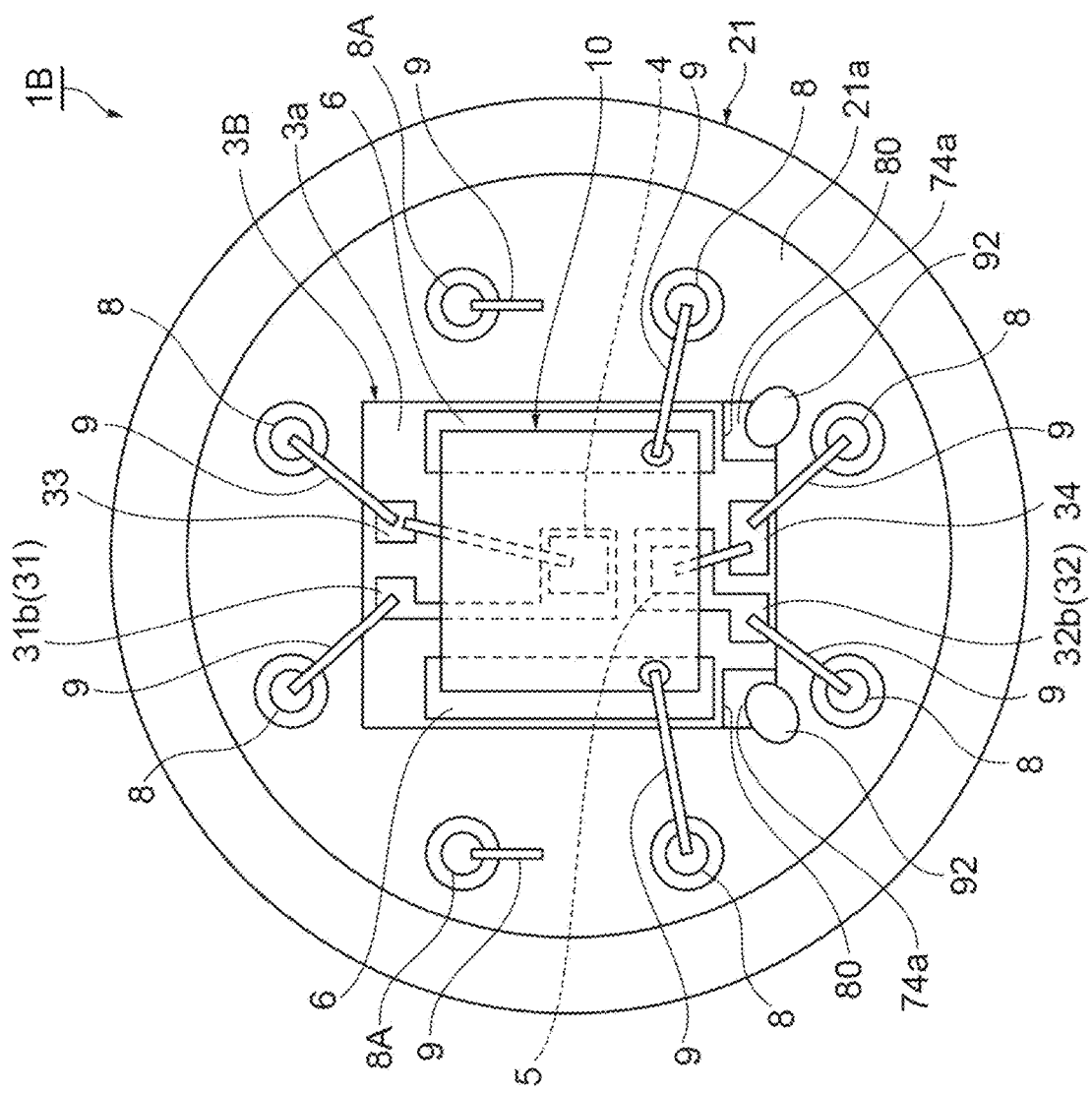
FIG. 11 is a plan view of a spectroscopic sensor according to a second embodiment.
Figure 12:
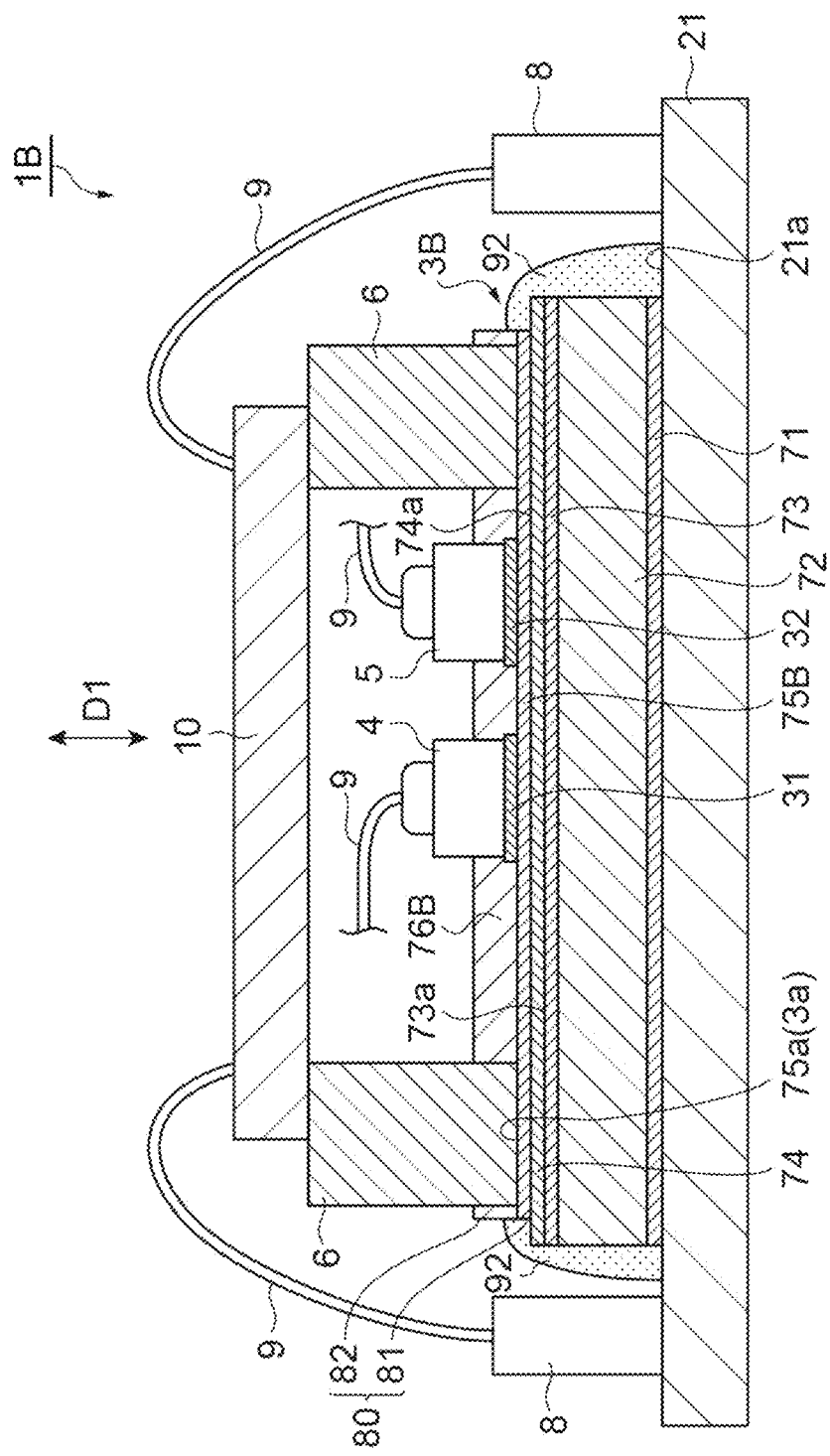
FIG. 12 is a schematic view showing a structure of a wiring substrate and an electrical connection configuration between components in the spectroscopic sensor according to the second embodiment.

As shown in FIGS. 11 and 12, a spectroscopic sensor 1B is different from the spectroscopic sensor 1A in that a wiring substrate 3B is included instead of the wiring substrate 3, and a conductive resin material 92 is provided instead of the wire 91 and the bonding pad 91a. The wiring substrate 3B is different from the wiring substrate 3 in that a third insulating layer 75B and a passivation film 76B are provided instead of the third insulating layer 75 and the passivation film 76. The metal layer 74 is provided to span an edge portion of the wiring substrate 3B as seen in the direction D1. That is, the metal layer 74 is provided at least on the edge portion of the wiring substrate 3B. Further, a portion of the metal layer 74 provided at the edge portion of the wiring substrate 3B is exposed to the outside. In the embodiment, as an example, an opening part 81 (a notch) is formed by removing a part of an edge portion of the third insulating layer 75B, and an opening part 82 (notch) continuous with the opening part 81 is formed by removing a part of an edge portion of the passivation film 76B. A part of the metal layer 74 is exposed to the outside by forming an opening part 80 including the opening part 81 and the opening part 82. In the spectroscopic sensor 1B, a part of the metal layer 74 exposed in the opening part 80 and the inner surface 21a of the stem 21 are electrically connected by the conductive resin material 92. The conductive resin material 92 is provided to cover the edge portion of the wiring substrate 3B, and is in contact with both a part of the metal layer 74 and the inner surface 21a of the stem 21. The conductive resin material 92 is, for example, a conductive silver paste, a conductive carbon paste, or the like.

In the embodiment, a current path from the Fabry-Perot interference filter 10 to the stem 21 via the spacer 6, the third insulating layer 75B, the metal layer 74, and the conductive resin material 92 corresponds to the second current path. According to the spectroscopic sensor 1B, the metal layer 74 and the stem 21 can be appropriately and easily connected by providing the conductive resin material 92 to cover the edge portion of the wiring substrate 3B.

Also in the spectroscopic sensor 1B, like the spectroscopic sensor 1A, a metal layer provided only on a part of the surface 73a of the second insulating layer 73 may be adopted instead of the metal layer 74. For example, as shown in FIGS. 13 and 14, metal layers 74E to 74H may be provided instead of the metal layer 74.

Figure 13:
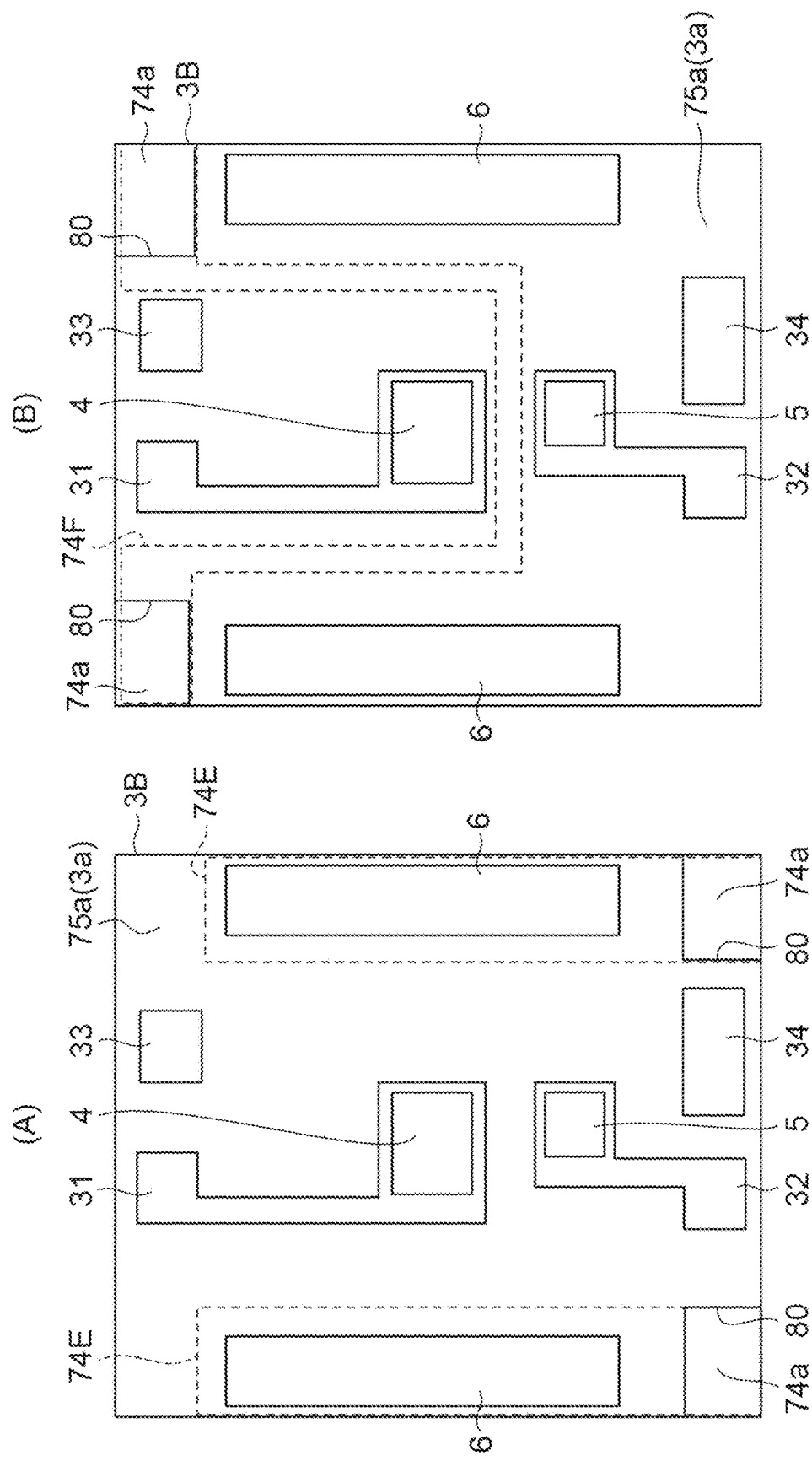
FIG. 13 is a view showing a modified example of the metal layer.
Figure 14:
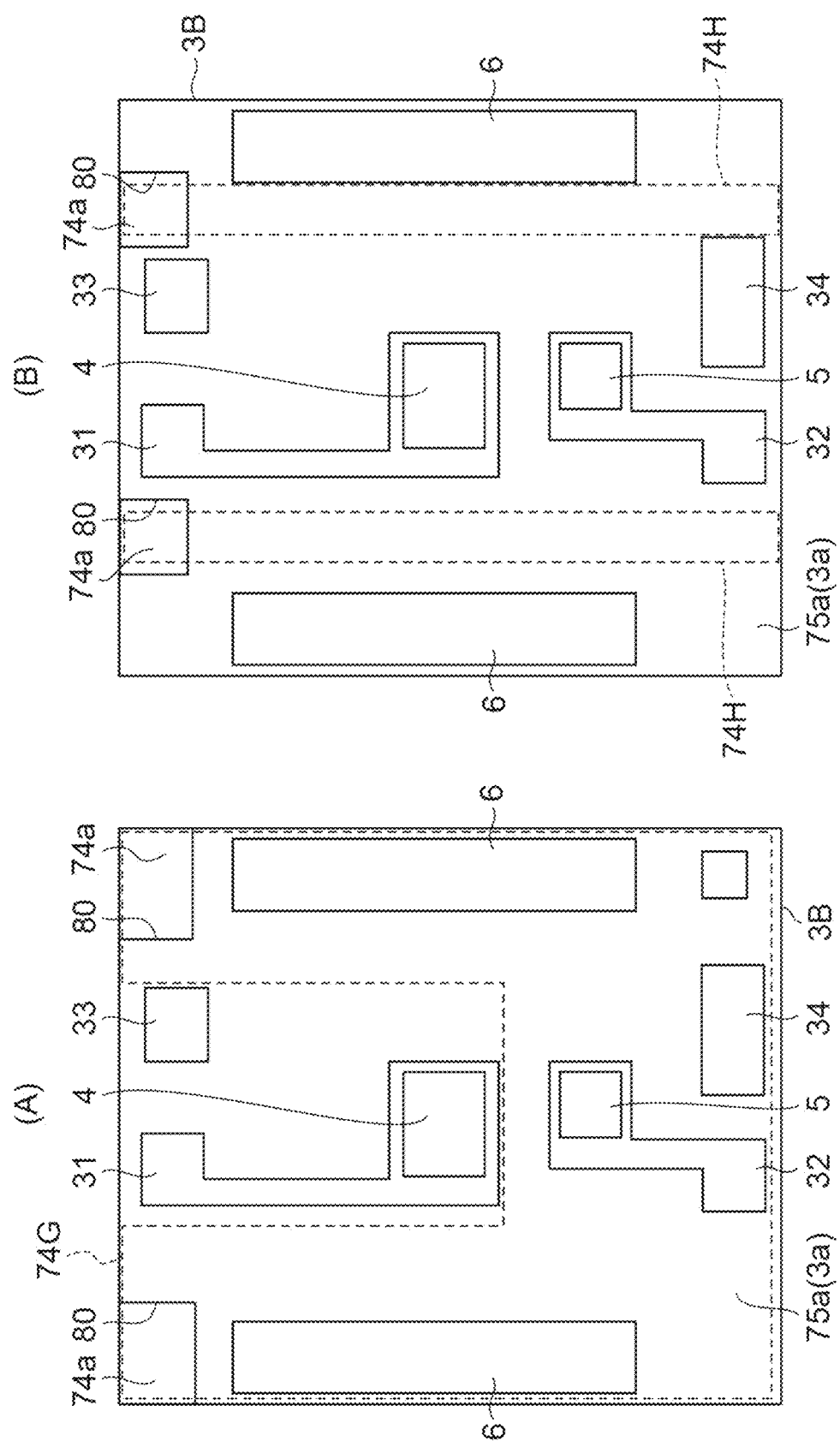
FIG. 14 is a view showing a modified example of the metal layer.

Two metal layers 74E shown in (A) of FIG. 13 have a configuration similar to that of the above-described metal layer 74A. That is, each of the metal layers 74E is provided to overlap the region on the wiring substrate 3 in which each of the spacers 6 is provided when seen in the direction D1. Each of the metal layers 74E extends to an edge portion (here, a corner portion) of the wiring substrate 3B, and the opening part 80 is formed in the corner portion. In the opening part 80, a part of a surface 74a of each of the metal layers 74E is exposed. The conductive resin material 92 is provided to cover the exposed surface 74a. According to the configuration, similar to the metal layer 74A, the current component which flows from the Fabry-Perot interference filter 10 to the wiring substrate 3 via the spacer 6 can be appropriately released to the stem 21 via the metal layer 74E provided in the region directly below the spacer 6. More specifically, the current component which flows from the bottom surface of the spacer 6 to the wiring substrate 3 can be reliably captured by the metal layer 74E provided in the region directly below the spacer 6. As a result, the current component can be appropriately induced to the stem 21.

The metal layer 74F shown in (B) of FIG. 13 has a configuration similar to that of the above-described metal layer 74B. That is, the metal layer 74F is provided to overlap an arbitrary current path between the region in which the spacer 6 is provided and the light detector 4 when seen in the direction D1. Thus, the current component which will flow from the region in which the spacer 6 is provided to the light detector 4 can be appropriately captured by the metal layer 74F and can be released to the stem 21. Here, as an example, the opening part 80 is formed at each of two corners of the wiring substrate 3B, and a part of the surface 74a of the metal layer 74F is exposed at each of the opening parts 80. The conductive resin material 92 is provided to cover the exposed surface 74a.

The metal layer 74G shown in (C) of FIG. 13 has a configuration similar to that of the above-described metal layer 74C. That is, the metal layer 74G is provided in a region other than a rectangular region including the wiring layer 31 (here, the region including the wiring layer 31 and the electrode pad 33). Further, the opening part 80 is formed in a region in which the metal layer 74C and the spacer 6 do not overlap (here, as an example, two corners of the wiring substrate 3B), and a part of the surface 74a of the metal layer 74G is exposed in each of the opening parts 80. The conductive resin material 92 is provided to cover the exposed surface 74a. According to such a metal layer 74G, the above-described effects of both the metal layer 74E and the metal layer 74F are exhibited.

Two metal layers 74H shown in (D) of FIG. 13 have a configuration similar to that of the above-described metal layer 74D. That is, the metal layer 74H is provided in the extending direction of each of the spacers 6 (the direction orthogonal to the direction in which the spacers 6 face each other) to divide an arbitrary current path between the region in which each of the spacers 6 is provided and the light detector 4 when seen in the direction D1. The opening part 80 is formed at an end portion of each of the metal layers 74H (an edge portion of the wiring substrate 3B), and a part of the surface 74a of the metal layer 74H is exposed at each of the opening parts 80. The conductive resin material 92 is provided to cover the exposed surface 74a. The two metal layers 74H also have the same effect as the above-described metal layer 74E.

Further, the metal layers 74E to 74H are provided not to overlap the wiring layer 31 when seen in the direction D1, like the metal layers 74A to 74D. Thus, the parasitic capacitance generated in the wiring layer 31 can be appropriately curbed. As a result, it is possible to curb a decrease in the response speed of the detection signal of the light detector 4 due to the parasitic capacitance. Further, as in the case in which the above-described metal layer 74B or metal layer 74D is used, when the metal layer 74F or the metal layer 74H is used, parts of the metal layers 74F and 74H may be brought into contact with the silicon layer 72 by providing an opening in a part of the second insulating layer 73 located between the metal layers 74F and 74H and the silicon layer 72 to enhance the effect of reducing the crosstalk noise.

Third Embodiment

Figure 15:
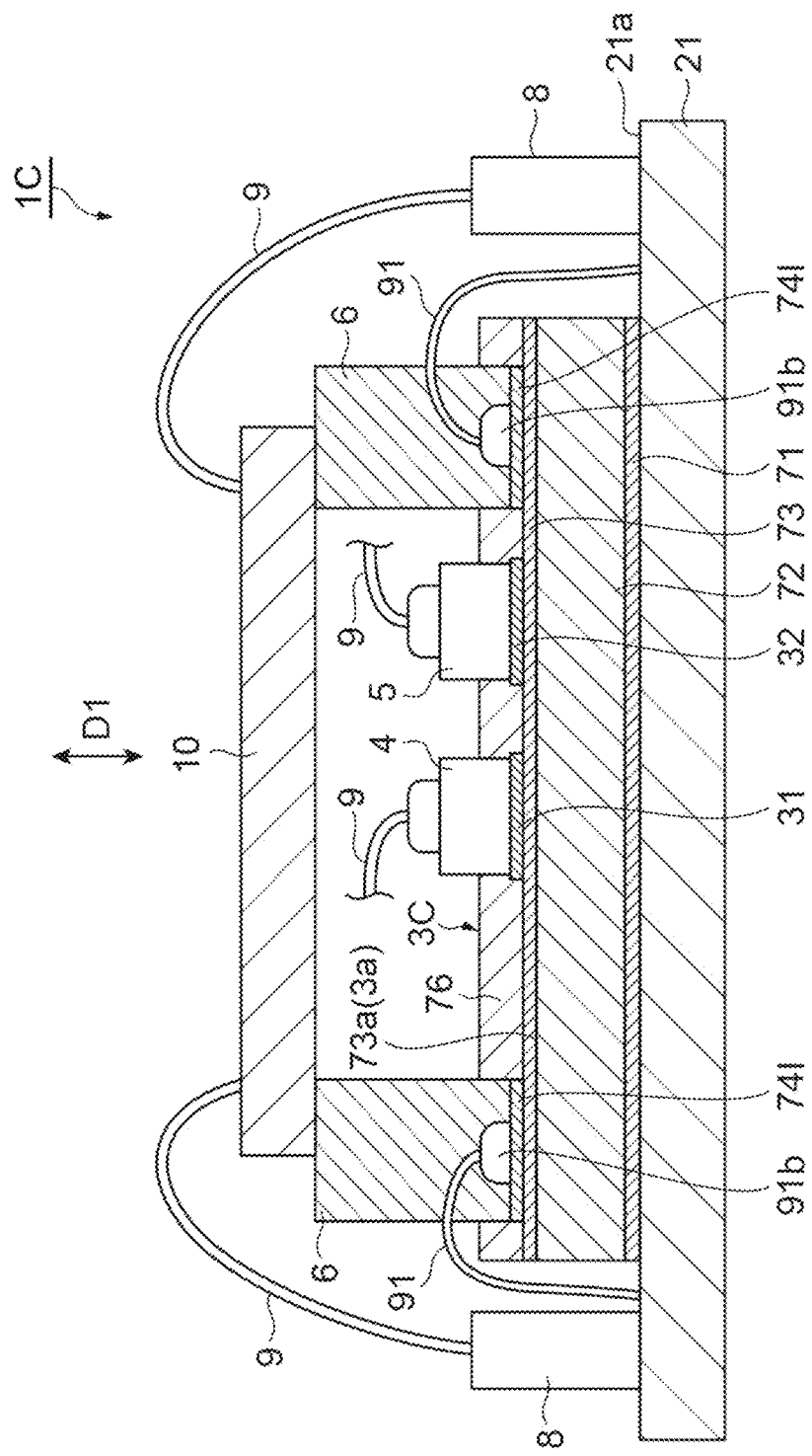
FIG. 15 is a schematic view showing a structure of a wiring substrate and an electrical connection configuration between components in a spectroscopic sensor according to a third embodiment.
Figure 16:
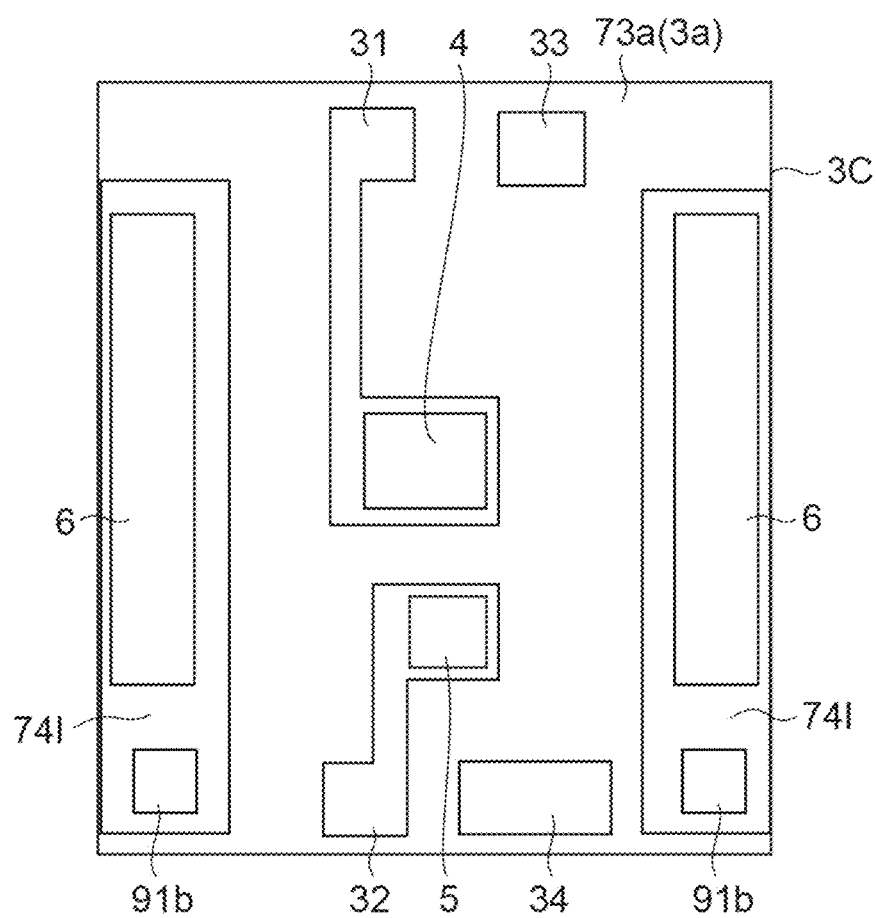
FIG. 16 is a plan view of the wiring substrate of the spectroscopic sensor according to the third embodiment.

As shown in FIGS. 15 and 16, a spectroscopic sensor 1C is different from the spectroscopic sensor 100 in that a wiring substrate 3C is included instead of the wiring substrate 110 and connecting members (the wire 91 and the bonding pad 91b) are further included. The wiring substrate 3C is different from the wiring substrate 110 in that a metal layer 74I provided between the second insulating layer 73 and the spacer 6 is included. In the embodiment, as an example, a metal layer 74I is formed in a region which includes the spacer 6 and has a size larger than the spacer 6 when seen in the direction D1. However, the metal layer 74I may be formed to have substantially the same size as the bottom surface of the spacer 6 (the surface which faces the wiring substrate 3C). The metal layer 74I is formed of, for example, a laminated film made of Cr—Pt—Au, similarly to the wiring layer 31. However, the metal layer 74I may be formed of a material other than the above-described material and may be formed of, for example, a single-layer film such as Al or Au, or a laminated film such as Ti—Pt—Au, Ti—Ni—Au or Cr—Au.

In the spectroscopic sensor 1C, the bonding pad 91b is provided in a portion of the metal layer 74I in which the spacer 6 is not disposed. Additionally, the bonding pad 91b and the inner surface 21a of the stem 21 are electrically connected by the wire 91. In the embodiment, a current path which extends from the Fabry-Perot interference filter 10 to the stem 21 via the spacer 6, the metal layer 74I, the bonding pad 91b, and the wire 91 corresponds to the second current path. According to the configuration, the current component which flows from the Fabry-Perot interference filter 10 to the wiring substrate 3C via the spacer 6 can be preferably released to the stem 21 from the metal layer 74I provided in the region directly below the spacer 6. More specifically, the current component which flows from the bottom surface of the spacer 6 into the wiring substrate 3C can be reliably captured by the metal layer 74I provided in the region directly below the spacer 6. As a result, the current component can be appropriately induced to the stem 21. Further, a manufacturing process of the wiring substrate 3C can be simplified by providing the metal layer 74I for releasing the current component to the stem 21 on the same layer as the wiring layer 31 (on the surface 73a of the second insulating layer 73). Specifically, as compared with the spectroscopic sensors 1A and 1B described above, the process is simplified by an amount that steps of forming the metal layer 74 and the third insulating layers 75 and 75B can be omitted.

Fourth Embodiment

Figure 17:
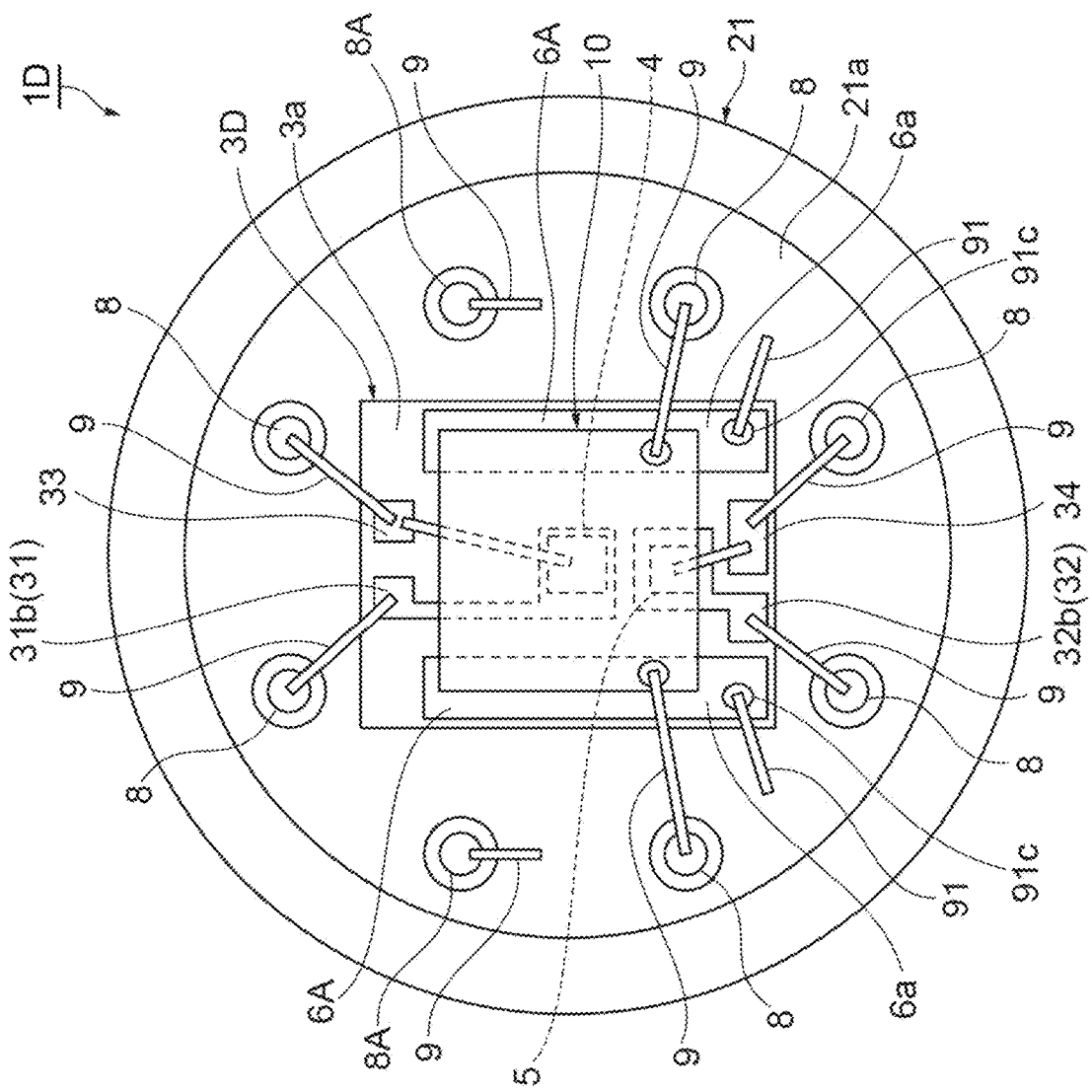
FIG. 17 is a plan view of a spectroscopic sensor according to a fourth embodiment.
Figure 18:
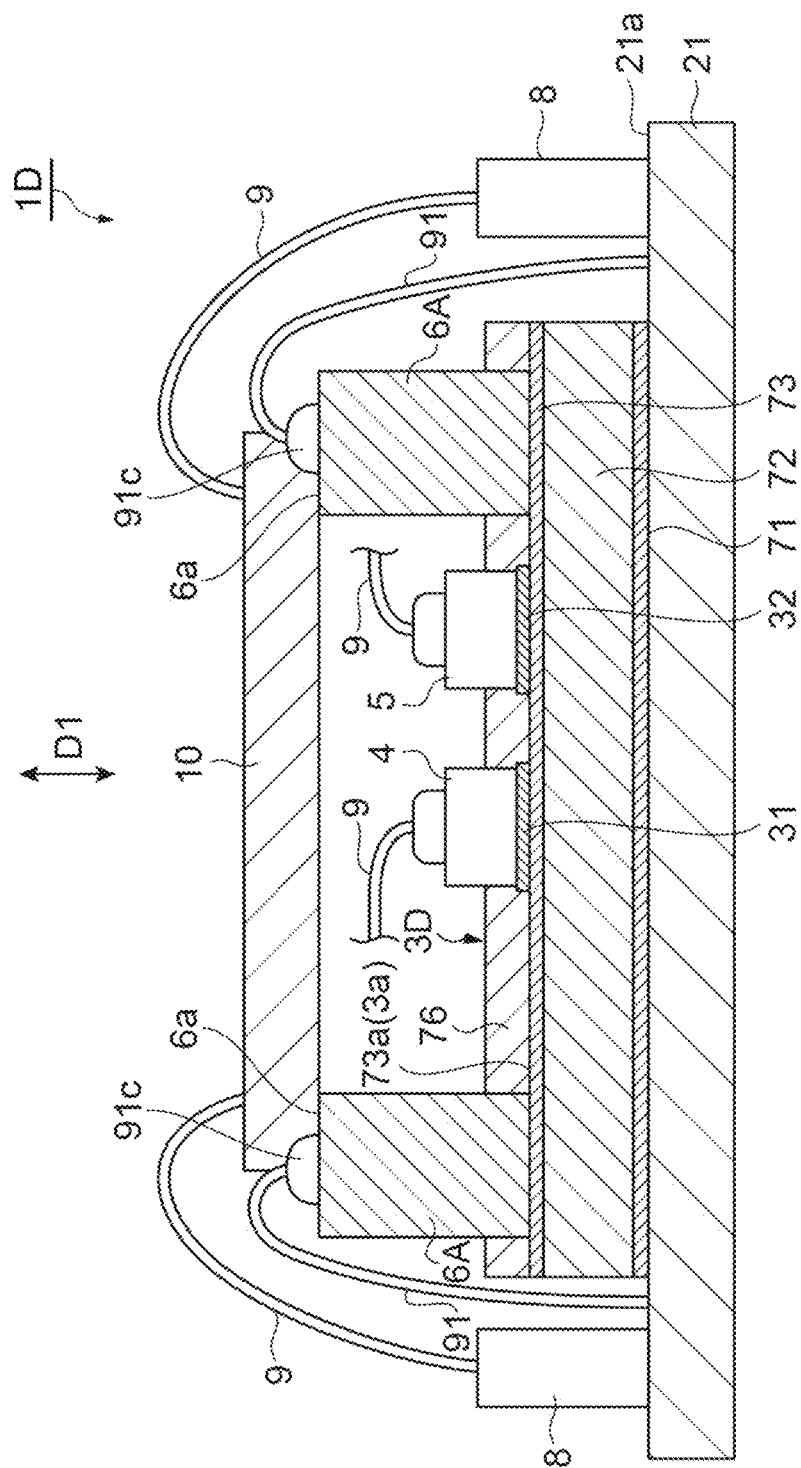
FIG. 18 is a schematic view showing a structure of a wiring substrate and an electrical connection configuration between components in the spectroscopic sensor according to the fourth embodiment.

As shown in FIGS. 17 and 18, a spectroscopic sensor 1D includes a wiring substrate 3D having the same configuration as that of the wiring substrate 110. On the other hand, the spectroscopic sensor 1D includes a spacer 6A having a region for wire bonding (a region required for providing the bonding pad 91c). As an example in the embodiment, the region is a portion of an upper surface 6a of the spacer 6A supporting the Fabry-Perot interference filter 10 which does not overlap the Fabry-Perot interference filter 10 when seen in the direction D1. The bonding pad 91c is provided in the above-described region. Then, the bonding pad 91c and the inner surface 21a of the stem 21 are electrically connected by the wire 91. That is, the spectroscopic sensor 1D includes a connecting member (the bonding pad 91c and the wire 91) which electrically connects the upper surface 6a of the spacer 6A to the inner surface 21a of the stem 21. In the embodiment, a current path from the Fabry-Perot interference filter 10 to the stem 21 via the spacer 6A, the bonding pad 91c, and the wire 91 corresponds to the second current path. Therefore, according to the configuration, before the current component which flows from the Fabry-Perot interference filter 10 to the spacer 6A reaches the wiring substrate 3D, the current component can be appropriately released from the spacer 6A to the stem 21. In the embodiment, the bonding pad 91c is provided on the upper surface 6a of the spacer 6A, but the bonding pad 91c may be provided on another place (for example, a side surface of the spacer 6A). That is, a portion (for example, a side surface) other than the upper surface 6a of the spacer 6A and the stem 21 may be electrically connected. Further, a part (for example, a side surface) of the spacer 6A and the stem 21 may be connected by a connecting member similar to the above-described conductive resin material 92 instead of the bonding pad and the wire.

Fifth Embodiment

Figure 19:
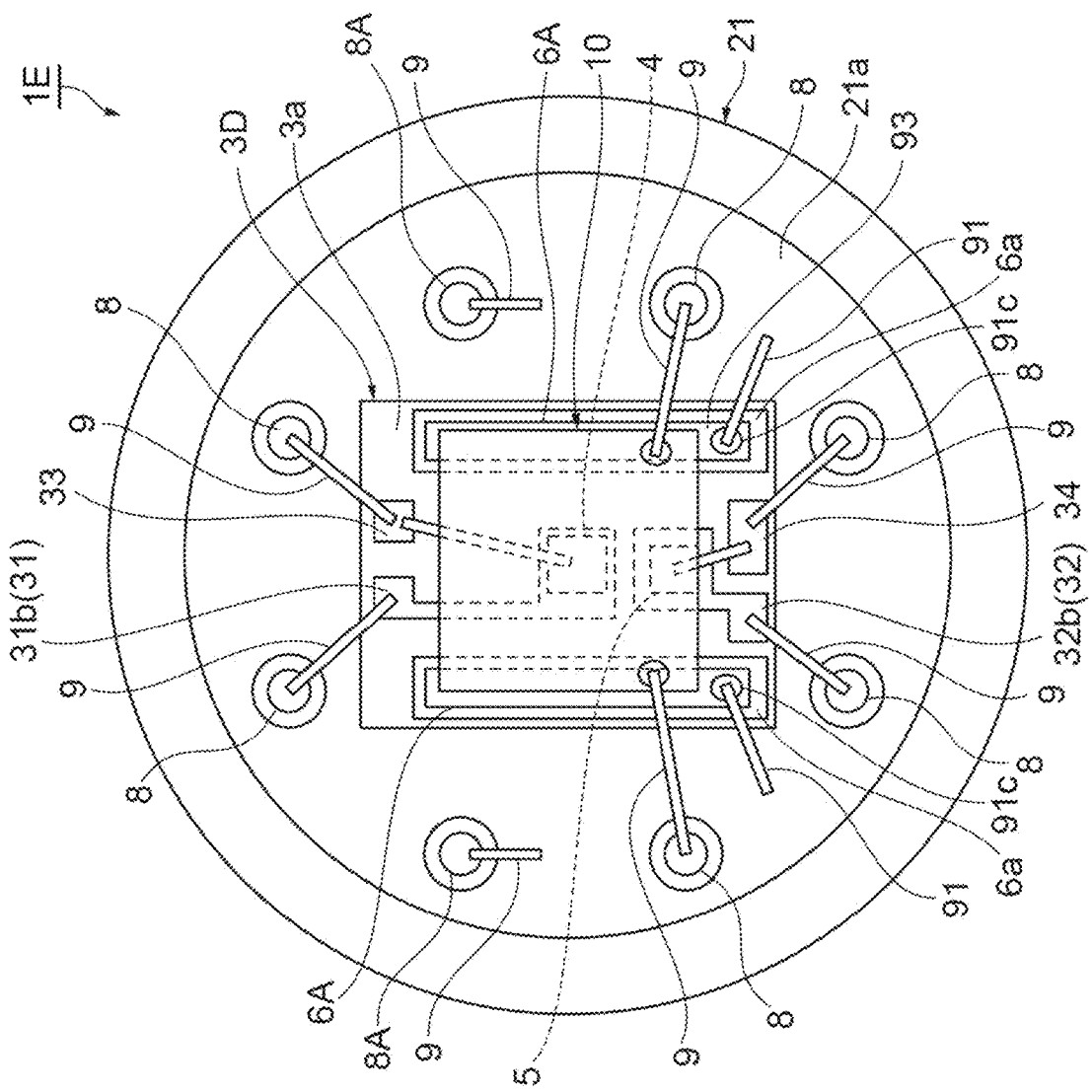
FIG. 19 is a plan view of a spectroscopic sensor according to a fifth embodiment.
Figure 20:
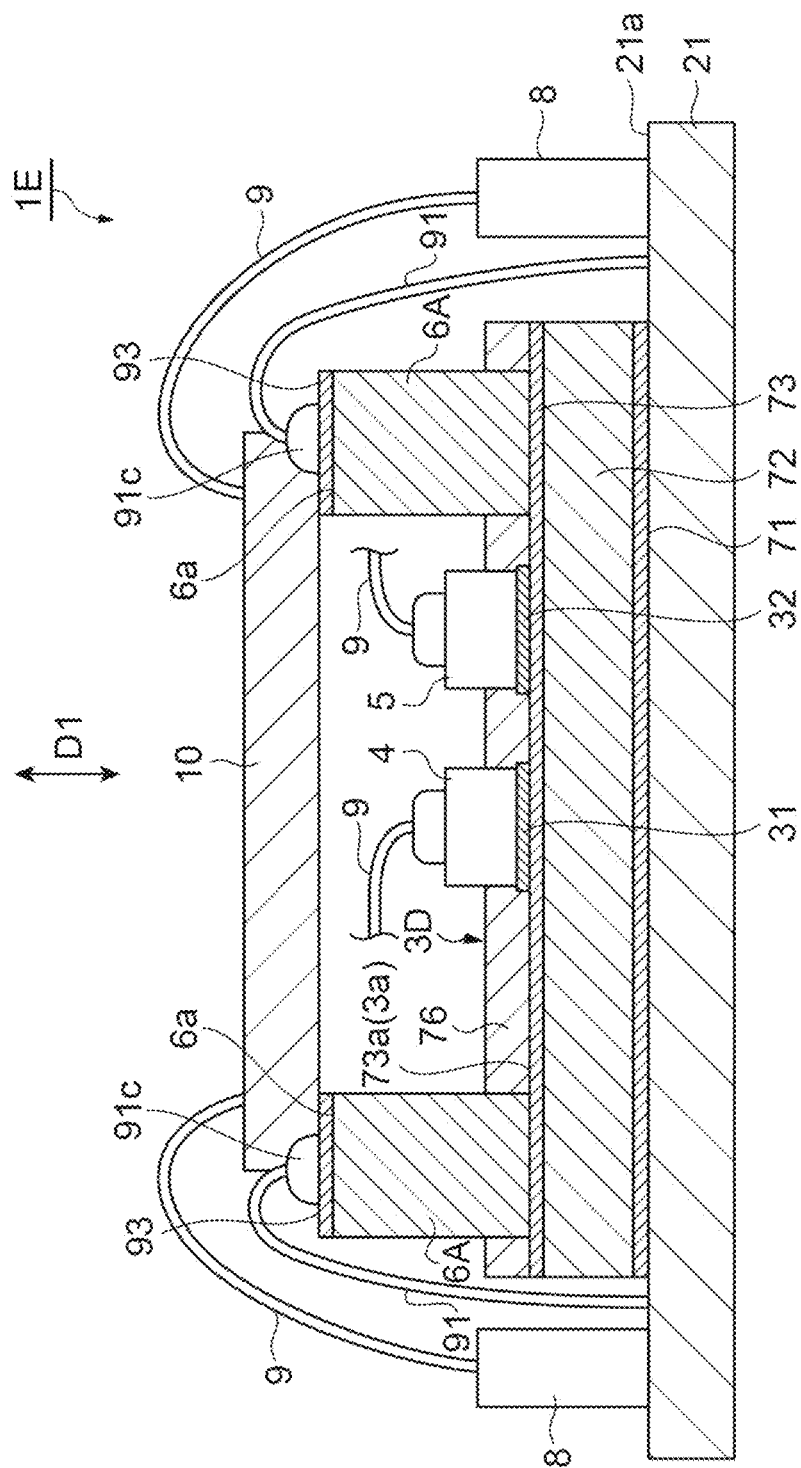
FIG. 20 is a schematic view showing a structure of a wiring substrate and an electrical connection configuration between components in the spectroscopic sensor according to the fifth embodiment.

As shown in FIGS. 19 and 20, a spectroscopic sensor 1E is different from the spectroscopic sensor 1D in that a metal film 93 disposed on the upper surface 6a of the spacer 6A is further included, and the bonding pad 91c is provided on a metal film 93. In the spectroscopic sensor 1E, the metal film 93 is disposed between the upper surface 6a of the spacer 6A and the Fabry-Perot interference filter 10. The metal film 93 has a portion which does not overlap the Fabry-Perot interference filter 10 when seen in the direction D1, and the bonding pad 91c is provided in the portion. The metal film 93 is formed on the upper surface 6a by forming a single-layer film of a metal material (for example, Au or the like) or a laminated film of Ti—Pt—Au, Ti—Ni—Au, Cr—Au or the like by vapor deposition or sputtering, for example. The connecting member (the bonding pad 91c and the ire 91) electrically connects the spacer 6A to the inner surface 21a of the stem 21 via the metal film 93. In the embodiment, a current path which extends from the Fabry-Perot interference filter 10 to the stem 21 via the metal film 93, the bonding pad 91c, and the wire 91 corresponds to the second current path. Therefore, according to the configuration, the current component which flows from the Fabry-Perot interference filter 10 toward the spacer 6A can be appropriately released from the metal film 93 to the stem 21 before it reaches the spacer 6A. The metal film 93 may be provided on the side surface of the spacer 6A, and the metal film 93 and the inner surface 21a of the stem 21 may be electrically connected by the connecting member (the bonding pad and the wire, or the conductive resin material). In this case, the current path which extends from the Fabry-Perot interference filter 10 to the stem 21 via the spacer 6A, the metal film 93, and the connecting member corresponds to the second current path.

Sixth Embodiment

Figure 21:
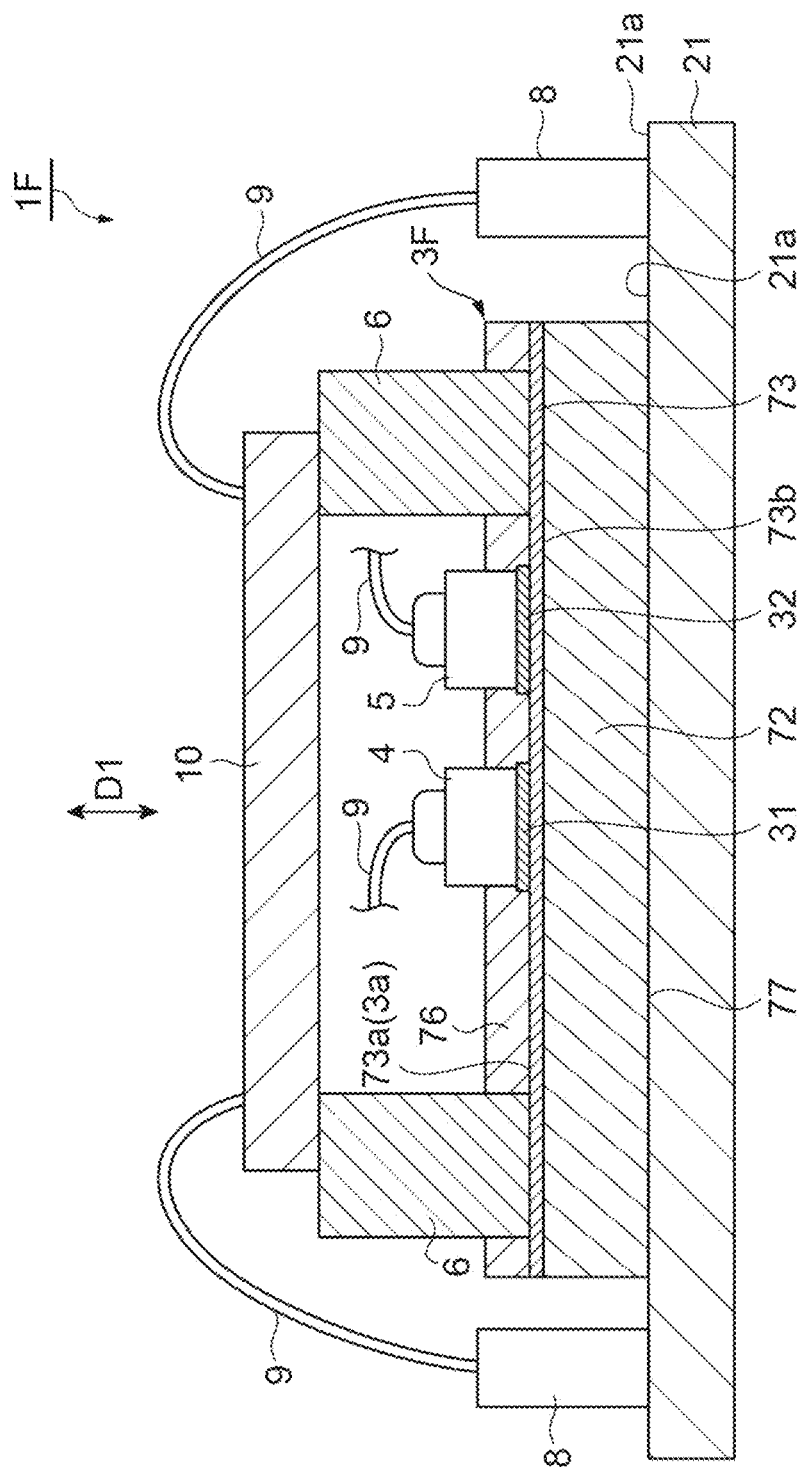
FIG. 21 is a schematic view showing a structure of a wiring substrate and an electrical connection configuration between components in a spectroscopic sensor according to a sixth embodiment.

As shown in FIG. 21, a spectroscopic sensor 1F is different from the spectroscopic sensor 100 in that a wiring substrate 3F is provided instead of the wiring substrate 110. The wiring substrate 3F is different from the wiring substrate 110 in a point that the first insulating layer 71 is removed and a point that a surface of the silicon layer 72 (the second layer) on the side opposite to the second insulating layer 73 (the first layer) comes into contact with the inner surface 21a of the stem 21 via an adhesive layer 77 (a connecting member) made of a conductive resin. That is, the wiring substrate 3F includes a second insulating layer 73 having a surface 73a (a first surface) as the main surface 3a and a back surface 73b (a second surface) on the side opposite to the surface 73a, and a silicon layer 72 provided on the back surface 73b side of the second insulating layer 73. The adhesive layer 77 is disposed between the surface of the silicon layer 72 on the side opposite to the second insulating layer 73 and the inner surface 21a of the stem 21 and electrically connects the surface of the silicon layer 72 on the side opposite to the second insulating layer 73 to the inner surface 21a of the stem 21.

Figure 22:
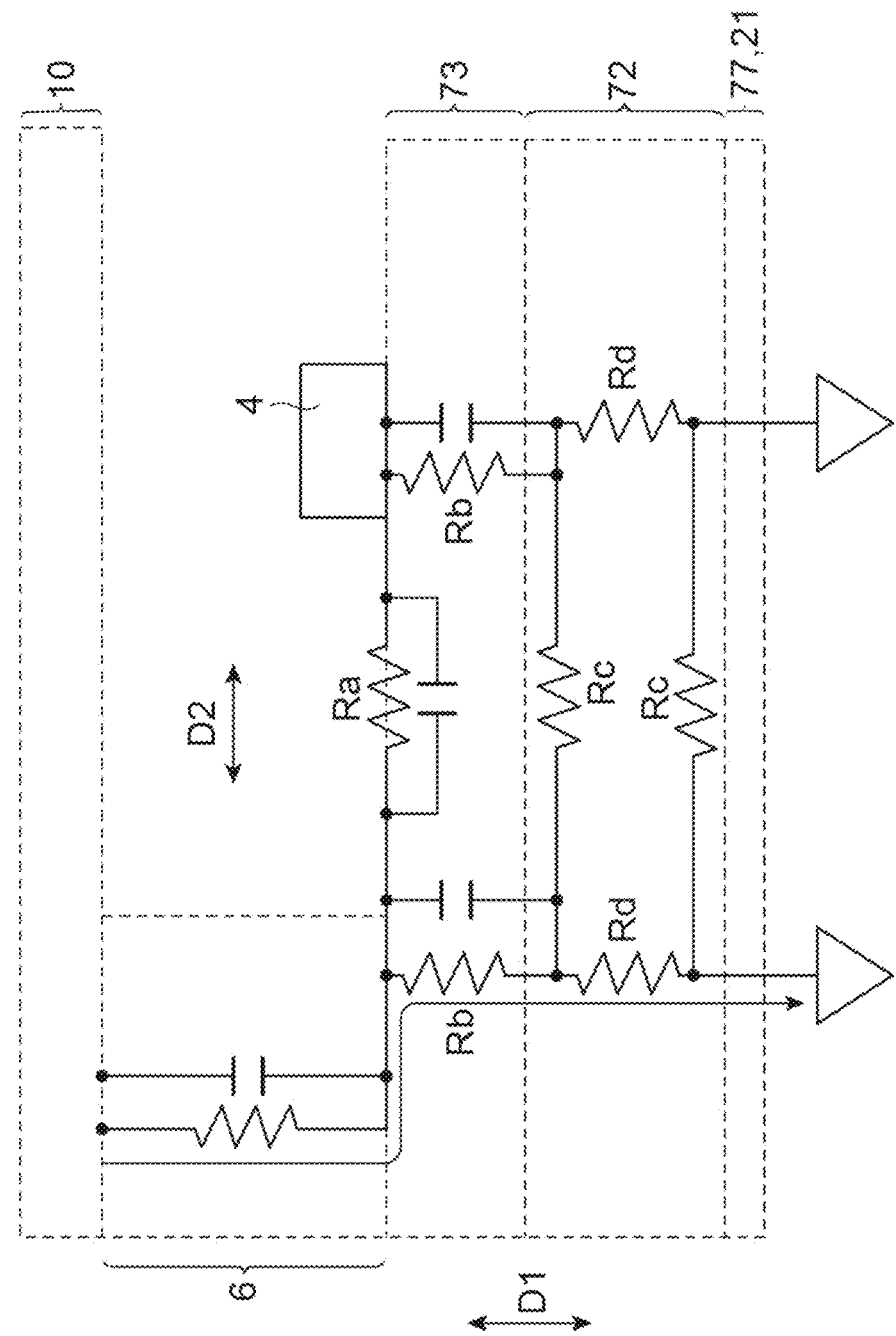
FIG. 22 is a view showing an equivalent circuit of the spectroscopic sensor according to the sixth embodiment.

FIG. 22 is a view showing an equivalent circuit of the spectroscopic sensor 1F. From a relationship between the equivalent circuit and the above-described electric resistance, it can be seen that the electrical resistance of the current path extending from the spacer 6 toward the stem 21 via the second insulating layer 73 and the silicon layer 72 is smaller than that of the current path extending from the spacer 6 to the light detector 4 via at least one of the second insulating layer 73 and the silicon layer 72. That is, the current path in a direction of an arrow shown in FIG. 22 corresponds to the second current path. Specifically, in the spectroscopic sensor 1F, the current path which extends from the Fabry-Perot interference filter 10 to the stem 21 via the spacer 6, the second insulating layer 73, the silicon layer 72, and the adhesive layer 77 corresponds to the second current path. According to the configuration, the current component which flows from the Fabry-Perot interference filter 10 to the wiring substrate 3F via the spacer 6 can be appropriately released to the stem 21 by passing through the inside of the wiring substrate 3F (the second insulating layer 73 and the silicon layer 72).

In the above-described embodiment, although the first layer is the second insulating layer 73 made of a silicon thermal oxide film, and the second layer is the silicon layer 72 made of silicon, the first layer and the second layer need only have the above-described relationship (that is, relationship that "the electrical resistance of the current path from the spacer 6 to the stem 21 via the first layer and the second layer is smaller than the electrical resistance of the current path from the spacer 6 to the light detector 4 via at least one of the first layer and the second layer"), and materials of the first layer and the second layer are not limited to the above examples. Further, the first layer or the second layer may be a layer in which a plurality of layers are grouped. That is, the first layer or the second layer may include a plurality of layers (for example, a layer formed of a plurality of different materials).

Figure 23:
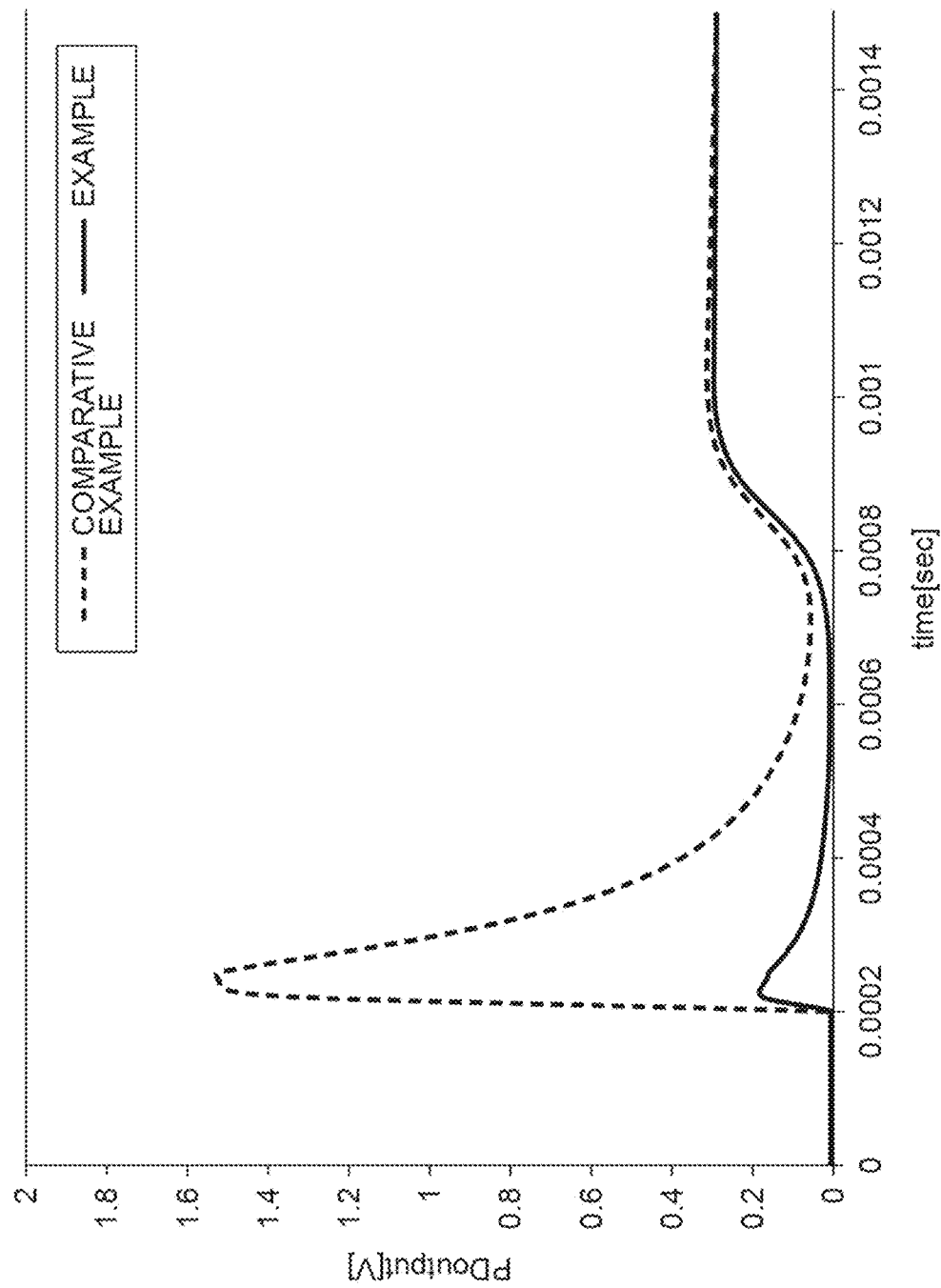
FIG. 23 is a view showing measurement results of crosstalk noise in an example (the sixth embodiment) and a comparative example.

FIG. 23 is a view showing measurement results of the crosstalk noise in the example (the spectroscopic sensor 1F) and the comparative example (the spectroscopic sensor 100). The measurement is performed by changing the driving voltage applied to the first electrode 42 and the third electrode 44 from 0 V to a voltage capable of transmitting light having a predetermined wavelength at a certain point in time (here, a point in time after 0.0002 seconds from the start of measurement) in a state in which light having a predetermined wavelength is continuously incident on the light transmission region 10a of the Fabry-Perot interference filter 10. As a result, in the comparative example, the crosstalk noise having a magnitude of about 1.5V was generated, whereas in the embodiment, the crosstalk noise could be curbed to a magnitude of about 0.2V. It is considered that such a crosstalk noise reduction effect is obtained by forming the second current path having a smaller electrical resistance than that of the arbitrary first current path extending from the Fabry-Perot interference filter 10 to the light detector 4 via the spacer and the wiring substrate between the Fabry-Perot interference filter 10 and the stem 21 (that is, by guiding the current component flowing from the Fabry-Perot interference filter 10 to the wiring substrate via the spacer to the stem 21 instead of the light detector 4). Therefore, it is considered that the same crosstalk noise reduction effect can also be obtained in the spectroscopic sensors 1A to 1E in which the second current path (that is, the path through which the current component from the Fabry-Perot interference filter 10 is positively released to the stem 21) is formed as in the spectroscopic sensor 1F.

Although some embodiments of the disclosure have been described above, the disclosure is not limited to the above-described embodiments, a part of the configuration in the above-described one embodiment or modified example can be arbitrarily applied to the configuration in another embodiment or modified example. For example, in order to reduce the current component flowing from the Fabry-Perot interference filter 10 to the light detector 4 as much as possible and to enhance the crosstalk noise reduction effect, some of the above-described embodiments may be combined as appropriate. For example, a configuration (for example, one of the first to third embodiments) in which a region (the metal layers 74, and 74A to 74I) along the main surface 3a of the wiring substrate and the stem 21 are electrically connected, and a configuration (for example, the fourth or fifth embodiment) in which the spacer 6A and the stem 21 are electrically connected may be combined. A current path for releasing the current component from the Fabry-Perot interference filter 10 to the stem 21 (a path having a smaller electric resistance than that of the current path extending from the Fabry-Perot interference filter 10 to the light detector 4) can be provided in multiple stages by combining a plurality of configurations. As a result, the current component which affects the light detector 4 can be reduced as much as possible, and the crosstalk noise can be curbed even more effectively.

Further, in the above-described embodiment, although the stem 21 is used as a ground part (a guidance destination of the current component from the Fabry-Perot interference filter 10) connected to the ground potential, a member other than the stem 21 may be used as the ground part. For example, in the first embodiment, the wire 91 may be directly connected to the lead pin 8A connected to the ground potential. In this case, the lead pin 8A serves as the ground part.

Further, in the above-described embodiment, although a wiring substrate having a wiring structure (the wiring layers 31 and 32, and the like) for mounting the light detector 4 and the temperature compensation element 5 is used, a substrate (a mounting substrate) which does not have the above-described wiring structure may be used instead of the wiring substrate. When such a substrate is used, the electrical connection to the light detector 4 or the temperature compensation element 5 may be realized, for example, by directly connecting the light detector 4 or the temperature compensation element 5 to the wire 9. Further, in this case, the light detector 4 or the temperature compensation element 5 may be disposed on the substrate via, for example, a thin plate-shaped member.

REFERENCE SIGNS LIST 1A,1B,1C,1D,1E,1F Spectroscopic sensor (light detection device)
21 Stein (ground part)
3, 3B, 3C, 3D, 3F Wiring substrate (mounting substrate)
3a Main surface
4 Light detector
6, 6A Spacer (support member)
10 Fabry-Perot interference filter
55 First mirror part
56 Second mirror part
72 Silicon layer (second layer)
73 Second insulating layer (first layer)
74, 74A, 74B, 74C, 74D, 74E, 74F, 74G, 74H, 74I Metal layer
74a Surface
75, 75B Third insulating layer (insulating layer)
75a First surface
75b Second surface
75c Opening
77 Adhesive layer (connecting member)
91 Wire (connecting member)
91a, 91b, 91c Bonding pad
92 Conductive resin material (connecting member)
93 Metal film
S Void

The invention claimed is:

1. A light detection device comprising:
a mounting substrate having a main surface, the main surface being an outermost surface of the mounting substrate;
a light detector that includes one or more light receivers, the light detector having a surface that faces the main surface of the mounting substrate and that is disposed on the main surface of the mounting substrate;
a Fabry-Perot interference filter configured so that a distance between a pair of mirror parts changes due to an electrostatic force by forming a gap between the pair of mirror parts facing each other;
a support provided on the main surface of the mounting substrate and configured to support the Fabry-Perot interference filter so that the Fabry-Perot interference filter and the light detector are spaced apart from each other; and
a ground part connected to a ground potential,
wherein a second current path having a smaller electrical resistance than that of an arbitrary first current path extending from the Fabry-Perot interference filter to the light detector via the support and the mounting substrate is formed between the Fabry-Perot interference filter and the ground part.

2. The light detection device according to claim 1, further comprising a conductive connector configured to electrically connect the support or the mounting substrate to the ground part so that a current component flowing from the Fabry-Perot interference filter to the support is released to the ground part.

3. The light detection device according to claim 2, wherein:
the connector electrically connects a region along the main surface of the mounting substrate to the ground part, and
the second current path is a path extending from the Fabry-Perot interference filter to the ground part via the support, the region along the main surface, and the connector.

4. The light detection device according to claim 3, wherein:
the mounting substrate includes an insulating layer having a first surface as the main surface and a second surface on a side opposite to the first surface, and a metal layer provided on the second surface side of the insulating layer, and
the region along the main surface is the metal layer.

5. The light detection device according to claim 4, wherein:
an opening part which exposes a surface of the metal layer on an insulating layer side is formed in the insulating layer, and
the connector is connected to the metal layer via the opening part and is connected to the ground part.

6. The light detection device according to claim 4, wherein:
the metal layer is provided at least at an edge portion of the mounting substrate when seen in a thickness direction of the mounting substrate,
a portion of the metal layer provided at the edge portion of the mounting substrate is exposed to an outside, and
the connector is a conductive resin material which is provided to cover the edge portion of the mounting substrate and connects the portion of the metal layer to the ground part.

7. The light detection device according to claim 4, wherein the metal layer is provided to overlap a region on the mounting substrate in which the support is provided when seen in a thickness direction of the mounting substrate.

8. The light detection device according to claim 4, wherein the metal layer is provided not to overlap the light detector when seen in a thickness direction of the mounting substrate.

9. The light detection device according to claim 8, wherein the metal layer is provided to overlap an arbitrary current path between the region on the mounting substrate in which the support is provided and the light detector when seen in the thickness direction of the mounting substrate.

10. The light detection device according to claim 3, wherein:
the mounting substrate has an insulating layer having a first surface as the main surface, and a metal layer provided between the first surface of the insulating layer and the support, and
the region along the main surface is the metal layer.

11. The light detection device according to claim 2, wherein:
the ground part is a stem to which a surface of the mounting substrate on a side opposite to the main surface is fixed,
the mounting substrate includes a first layer having a first surface as the main surface and a second surface on a side opposite to the first surface, and a second layer provided on the second surface side of the first layer,
the connector is disposed between a surface of the second layer on a side opposite to the first layer and the stem, and electrically connects the surface of the second layer on the side opposite to the first layer to the stem,
an electrical resistance of a current path extending from the support to the stem via the first layer and the second layer is smaller than that of a current path extending from the support to the light detector via at least one of the first layer and the second layer, and
the second current path is a path extending from the Fabry-Perot interference filter to the stem via the support, the first layer, the second layer, and the connector.

12. The light detection device according to claim 2, wherein:
the connector electrically connects the support to the ground part, and
the second current path is a path extending from the Fabry-Perot interference filter to the ground part via the support and the connector.

13. The light detection device according to claim 2, further comprising a metal film disposed between the support and the Fabry-Perot interference filter,
wherein the connector electrically connects the support to the ground part via the metal film, and
the second current path is a path extending from the Fabry-Perot interference filter to the ground part via the metal film and the connector.

14. The light detection device according to claim 1, wherein a material of the support is silicon, ceramic, quartz, glass or plastic.

* * * * *